United States Patent
Umekawa et al.

(10) Patent No.: US 9,228,035 B2
(45) Date of Patent: Jan. 5, 2016

(54) PHOTO-CURABLE NANOIMPRINT COMPOSITION, METHOD FOR FORMATTING PATTERN USING THE COMPOSITION, AND NANOIMPRINT REPLICA MOLD COMPRISING CURED PRODUCT OF THE COMPOSITION

(75) Inventors: Hideki Umekawa, Tsukuba (JP); Yuichiro Kawabata, Tsukuba (JP); Yuko Sasaki, Tsukuba (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 348 days.

(21) Appl. No.: 13/822,024

(22) PCT Filed: Oct. 19, 2011

(86) PCT No.: PCT/JP2011/074031
§ 371 (c)(1),
(2), (4) Date: Apr. 2, 2013

(87) PCT Pub. No.: WO2012/053543
PCT Pub. Date: Apr. 26, 2012

(65) Prior Publication Data
US 2013/0214453 A1  Aug. 22, 2013

(30) Foreign Application Priority Data

Oct. 20, 2010 (JP) ................................ 2010-235614
Mar. 28, 2011 (JP) ................................ 2011-069279

(51) Int. Cl.
| | |
|---|---|
| C08F 2/46 | (2006.01) |
| C08G 61/04 | (2006.01) |
| C08F 30/08 | (2006.01) |
| B82Y 10/00 | (2011.01) |
| B82Y 40/00 | (2011.01) |
| G03F 7/00 | (2006.01) |
| G03F 7/004 | (2006.01) |
| G03F 7/027 | (2006.01) |
| G03F 7/075 | (2006.01) |
| C09D 183/06 | (2006.01) |
| C08F 283/12 | (2006.01) |
| C08G 77/20 | (2006.01) |

(52) U.S. Cl.
CPC ................ *C08F 30/08* (2013.01); *B82Y 10/00* (2013.01); *B82Y 40/00* (2013.01); *C09D 183/06* (2013.01); *G03F 7/0002* (2013.01); *G03F 7/0046* (2013.01); *G03F 7/027* (2013.01); *G03F 7/0757* (2013.01); *C08F 283/124* (2013.01); *C08G 77/20* (2013.01)

(58) Field of Classification Search
CPC .... C08F 30/08; C08F 283/124; C08F 222/10; B82Y 10/00; B82Y 40/00; G03F 7/0002; G03F 7/027; G03F 7/0046; G03F 7/0757; C08G 77/20; C09D 183/06
USPC .................................... 522/99, 148, 1; 520/1
See application file for complete search history.

(56) References Cited

U.S. PATENT DOCUMENTS

| | | | |
|---|---|---|---|
| 7,431,858 B2 | 10/2008 | Spiess et al. | |
| 8,133,428 B2 | 3/2012 | Kaida et al. | |
| 8,557,502 B2 | 10/2013 | Furukawa | |
| 2005/0162881 A1 | 7/2005 | Stasiak et al. | |
| 2006/0128129 A1 | 6/2006 | Stasiak et al. | |
| 2009/0263631 A1 | 10/2009 | Sakamoto et al. | |
| 2010/0259821 A1* | 10/2010 | Kaida et al. | 359/486 |
| 2011/0057340 A1* | 3/2011 | Perichaud et al. | 264/36.22 |

FOREIGN PATENT DOCUMENTS

| | | | |
|---|---|---|---|
| CN | 101809046 | | 8/2010 |
| JP | 2005-217402 | | 8/2005 |
| JP | 2005-527110 | | 9/2005 |
| JP | 2007-072374 | | 3/2007 |
| JP | 2007-073078 | | 3/2007 |
| JP | 2008-019292 | | 1/2008 |
| JP | 2008248239 | | 10/2008 |
| JP | 2009-283760 | | 12/2009 |
| JP | 2010-171281 | | 8/2010 |
| KR | 10-2005-0007300 | | 1/2005 |
| TW | 201013316 | | 4/2010 |
| WO | 2008/014630 | * | 2/2008 |
| WO | 2009-041646 | | 4/2009 |
| WO | 2010013816 | | 2/2010 |
| WO | 2010067906 | | 6/2010 |

OTHER PUBLICATIONS

International Search Report PCT/JP2011/074031 dated Dec. 27, 2011, with English translation.

* cited by examiner

*Primary Examiner* — Ling Choi
*Assistant Examiner* — Jessica E Whiteley
(74) *Attorney, Agent, or Firm* — Young & Thompson

(57) ABSTRACT

Provided is a photo-curable nanoimprint composition that has excellent properties in terms of etching resistance, dispersibility, and productivity. In addition, the photo-curable nanoimprint composition enables easy transcription of patterns even when a mold is pressed with a relatively low pressure. The photo-curable nanoimprint composition includes: (A) partial hydrolysate obtained by hydrolyzing a mixture of an organic silicon compound and a silicon compound containing (meth)acrylic groups with water in the molar amount of not less than 0.1 times but less than 1.0 times with respect to the number of moles of all alkoxy groups present in the mixture; (B) polymerizable monomer containing (meth)aclyic groups; and (C) pothopolymerization initiator. In addition, the mixture of partial hydrolysate (A) may include further partial hydrolysate of fluorinated silicone compound and/or metal oxide.

16 Claims, 3 Drawing Sheets

F I G. 5
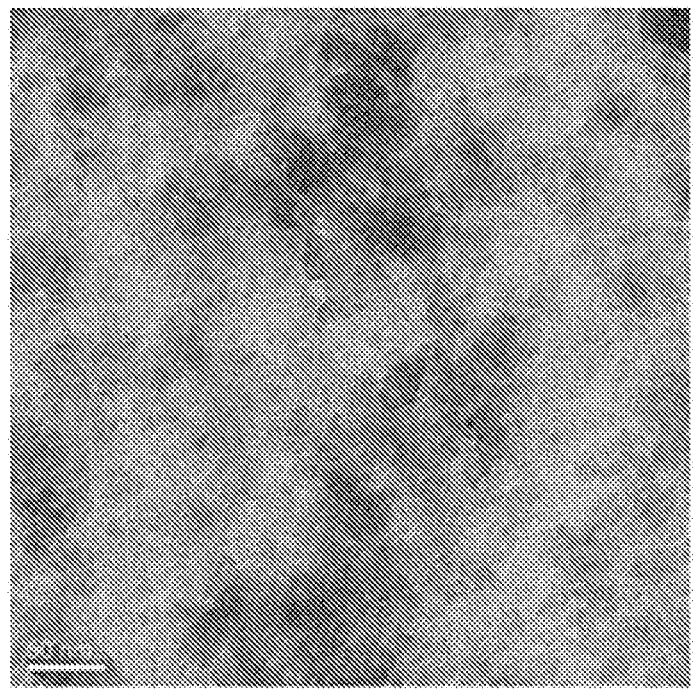

PHOTO-CURABLE NANOIMPRINT COMPOSITION, METHOD FOR FORMATTING PATTERN USING THE COMPOSITION, AND NANOIMPRINT REPLICA MOLD COMPRISING CURED PRODUCT OF THE COMPOSITION

TECHNICAL FIELD

The present invention relates to a novel photo-curable composition for nanoimprint (hereinafter, it is referred to as "photo-curable nanoimprint composition") and also to a novel method for forming a pattern on a substrate using said photo-curable nanoimprint composition. In addition, the present invention relates to a replica mold for nanoimprint (hereinafter, it is referred to as "nanoimprint replica mold"), which has a cured product of said composition.

BACKGROUND ART

Recently, there are demands for reduction in feature size and for high precision on semiconductor integrated circuit and the fine and high-precision semiconductor integrated circuit has generally been prepared by imprint technology.

The imprint technology is a technology for transcribing a desirable pattern to surface of a substrate by pressing a mold having concavity or convexity which corresponds to a desirable pattern to be formed on the substrate against a coating film which is formed on the surface of substrate. Utilizing this technology, it is possible to form a nano-scale fine pattern. Among the imprint technologies, the technology for forming an ultrafine pattern having size of from several hundreds to several nanometer (nm) is especially referred to as nanoimprint technology.

On the nanoimprint technology, a process for forming pattern is classified roughly into two types depending on type of material used in formation of coating film on surface of substrate. One type is a process for transcribing a pattern to coating film, which comprises steps of heating a coating film formed on surface of a substrate to plasticize, of pressing a mold against the coating film, and of cooling the coating film to solidify. Another type is a process in which at least one of used mold and substrate is made of light-permeable material and a pattern is transcribed by steps of applying a photo-curable composition in the form of liquid to a substrate to form a coating film, of pressing the mold against the coating film, and of irradiating the coating film with light through the mold or the substrate to cure the coating film. Among them, the photo-imprint process in which the pattern is transcribed through light-irradiation has widely been used as the nanoimprint technology, because it is possible to form a high-precision pattern. A development of photo-curable composition which can suitably be used in the photo-imprint process has been advanced.

In the nanoimprint technology, adhesion between surface of substrate and pattern obtained by curing coating film and release property between pattern and mold are important factors. In relation to release property, several techniques such as a process comprising a step of treating surface of mold with fluorine-containing surface preparation agent to invest the mold with release property, a process comprising a step of carrying out the imprint with intervention of flourine-containing gas such as pentafluoropropane gas, etc. at interface between photo-curable composition and mold have generally been known. On the other hand, the improvement of adhesion to substrate has been tried through the surface preparation of substrate or the modification of composition of the photo-curable composition.

Though the adhesion to substrate and the release property from mold are conflict properties, in order to increase productivity, further improvement is required. In order to invest a material for forming coating film with these conflict properties, an addition of fluorochemical surfactant or silicone compound to the material for forming coating film has been proposed (see Patent Literature 1). However, there is still room for improvement in coexistence of the adhesion to substrate and the release property from mold.

The nanoimprint technology is a process for forming a pattern on a substrate which has, on its surface, a cured coating film to which a pattern has been transcribed with a mold (hereinafter, it is referred to also as cured film), the pattern on the substrate being formed on the basis of the pattern of the cured film. In order to form the pattern on the substrate, the substrate is subjected to dry etching with oxygen gas, fluorine-containing gas, etc. at the lean part of the cured film and the part of substrate contacting with the lean part. Since, in the dry etching, the thick part of the cured film which protects the substrate is also etched, the etching speed ratio between substrate and the cured film is important. For that reason, various photo-curable compositions which is hardly etched by said etching gas have been developed (hereinafter, this property is also called "etching resistance").

In order to improve the etching resistance, the photo-curable composition comprising hydrolysable organic silicon compound has been proposed (see, for example, Patent Literatures 2-5). More particularly, the photo-curable composition comprising inorganic oxide particle or hydrolysable organic silicon compound has bee proposed (see Patent Literature 2). The photo-curable compositions comprising hydrolysate which is obtained by hydrolyzing hydrolysable silicon compound with water in the amount that is equal to or more than the number of moles of hydrolysable group have also been proposed (see Patent Literature 3, 4). Moreover, the photo-curable composition which comprises a compound produced by reaction between a compound having hydroxyl group and polymerizable group and a hydrolysable silicon compound has been proposed (see Patent Literature 5). Using these photo-curable compositions, it is possible to form a cured film having improved etching resistance.

However, the studies of inventors revel that even in the photo-curable compositions whose etching resistance is improved, there are rooms for improvement in the following points.

For example, since the inorganic oxide particles are used in the photo-curable composition disclosed in the Patent Literature 2, when insoluble impurities present in the photo-curable composition are removed, it is difficult to remove them by a filtration and subsequently there is a room for improvement in point of lowering productivity. There are easily left traces such as poor dispersion in the cured coating film (cured film) because of, probably, using the inorganic oxide particles, there is a room for improvement in case of forming finer pattern.

In the photo-curable compositions disclosed in the Patent Literatures 3 and 4, though it is presumed that it is caused by using plenty of water, there is a case that it is necessary to press the mold against the coating film with comparatively high pressure. In case that the mold is pressed against coating film with high pressure, the mold itself is easy to break and consequently is unsuitable for large-seized nanoimprint. Accordingly, in said photo-curable compositions, there is a room for improvement in the above-said point.

The photo-curable composition disclosed in the Patent Literature 5 has the composition in which the amount of water is reduced. Though, as being mentioned above, the photo-curable composition disclosed in the Patent Literature 5 comprises the organic silicon compound having polymerizable group, which is synthesized by an equilibrium reaction between hydroxyl group and alkoxy group, it is presumed that the reaction portion between hydroxyl group and alkoxy group is ease to be hydrolyzed again. For that reason, though it is presumed that it is caused by a fact that the dispersion state of hydrolysate of organic silicon compound (mainly inorganic component) in polymer of polymerizable monomer (mainly organic component) is deteriorated, there is a case that the filterability is lowered. There is also a case that the transcription property of pattern is poor and accordingly there is a room for improvement.

CITATION LIST

Patent Literature

Patent Literature 1: Japanese Patent Laid-open No. 2008-19292
Patent Literature 2: Japanese Patent National Laid-open No. 2005-527110
Patent Literature 3: Japanese Patent Laid-open No. 2007-72374
Patent Literature 4: Japanese Patent Laid-open No. 2007-73078
Patent Literature 5: Japanese Patent Laid-open No. 2009-283760

SUMMARY OF INVENTION

Technical Problem

An object of the present invention is to provide a photo-curable nanoimprint composition that has excellent properties in terms of etching resistance, dispersibility, and productivity. A further object of the present invention is to provide a photo-curable nanoimprint composition that enables easy transcription of pattern even when a mold is pressed with a relatively low pressure. A still further object of the present invention is to provide a method for forming a pattern on a substrate using the photo-curable nanoimprint composition. Further, an object of the present invention is to provide a nanoimprint replica mold comprising a cured coating film obtained by curing the coating film after transcribing a pattern.

Solution to Problem

The inventors have earnestly studied in order to solve the above problems. As a result, they found that a photo-curable composition comprising partial hydrolysates obtained by hydrolyzing organic silicon compound and (meth)acrylic group-containing silicon compound, each of which has a specific structure, with water in the specific amount makes a material for forming a coating film which provides excellent results and completed the present invention.

The present invention relates to a photo-curable nanoimprint composition, said composition comprising:
(A) partial hydrolysate,
(B) polymerizable monomer having (meth)acrylic group (hereinafter, there is a case that it is referred to simply as "polymeilizable monomer"); and
(C) photoinitiator, wherein said partial hydrolysate (A) is selected from a group consisting of
(A-1) mixture of partial hydrolysate of organic silicon compound having a general formula (1):

[Ka 1]

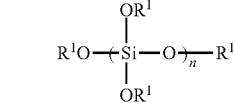

(1)

(wherein, each of $(R^1)$s is, same or different, C1-4 alkyl group; n is an integer of 1-10) and partial hydrolysate of (meth)acrylic group-containing silicon compound having a general formula (2):

[Ka 2]

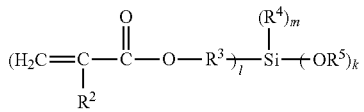

(2)

(wherein $R^7$ is hydrogen atom or methyl group; $R^3$ is C1-10 alkylene group, C3-10 cycloalkylene group, or C3-10 polymethylene group; $R^4$ is C1-4 alkyl group, C3-4 cycloalkyl group, or C6-12 aryl group; $R^5$ is C1-4 alkyl group or C3-4 cycloalkyl group; l is an integer of 1-3, m is an integer of 0-2, and k is an integer of 1-3, but (l+m+k) is 4; in case that each of $R^2$, $R^3$, $S^4$ and $R^5$ is present in plural, each of $(R^2)$s, $(R^3)$s, $(R^4)$s and $(R^5)$s may be same or different);

(A-2) mixture of partial hydrolysate of fluorinated organic silane compound having a general formula (3):

[Ka 3]

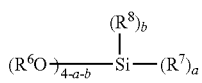

(3)

(wherein each of $R^6$ and $R^8$ is C1-10 alkyl group or C3-10 cycloalkyl group; $R^7$ is C1-100 fluorine-containing alkyl group, fluorine-containing cycloalkyl group, or fluorine-containing alkoxy ether group; a is an integer of 1-3 and b is an integer of 0-2, but (a+b) is 1-3; in case that each of $R^4$, $R^7$ and $R^8$ is present in plural, each of $(R^6)$s, $(R^7)$s and $(R^8)$s may be same or different) and said partial hydrolysate of (meth) acrylic group-containing silicon compound having the general formula (2); and (A-3) mixture of said partial hydrolysate of organic silicon compound having the general formula (1), said partial hydrolysate of (meth)acrylic group-containing silicon compound having the general formula (2), and said partial hydrolysate of fluorinated organic silane compound having the general formula (3).

In the present invention, the term "(meth)acrylic group" means methacrylic (or methacryloyl) group or acrylic (or acryloyl) group.

Advantageous Effects of Invention

The photo-curable nanoimprint composition of the present invention can suitably form a pattern having width and distance of line of from 5 nm to 100 μm and further a fine pattern having width and distance of line of from 5 nm to 500 nm. Of course, needless to say, the photo-curable composition of the present invention can be used in formation of a pattern having the width and distance of line of exceeding 100 μm.

Since the photo-curable composition of the present invention has excellent dispersibility, purification by filtration can easily be conducted even when insoluble impurities are mixed into the composition and accordingly the productivity becomes high. Moreover, using the composition in formation of coating film, a pattern can easily be transcribed to the film coating even when the mold is pressed against the coating film with a relatively low pressure. In addition, the cured film (pattern) obtained by curing the coating film has excellent adhesion to substrate and excellent etching resistance against oxygen gas.

Moreover, the cured film after transcription of pattern may easily react with, for example, silane coupling agent and accordingly its surface can easily be modified. For example, in case that a substrate having pattern made of the cured film is subjected to a surface preparation with silane coupling agent containing fluorine, the release property from other materials can be increased. Therefore, the substrate treated with the silane coupling agent can be used as a nanoimprint replica mold.

Especially, in case that the partial hydrolysate (A) comprises fluorinated organic silane compound, the cured film (pattern) obtained by curing the coating film through photo-nanoimprint technology has excellent release property from mold as well as the above-mentioned properties such as excellent adhesion to substrate, transcription property, etc.

Further, the photo-curable nanoimprint composition comprising metal alkoxide which will be described below has improved etching resistance against fluorine-containing gas.

BRIEF DESCRIPTION OF DRAWINGS

FIG. 5 is a photograph by field-emission type transmission electron microscopy observation, which shows fine structure of the cured film obtained by photo-curing the photo-curable nanoimprint composition used in Comparative Example 5.

Figure 1:
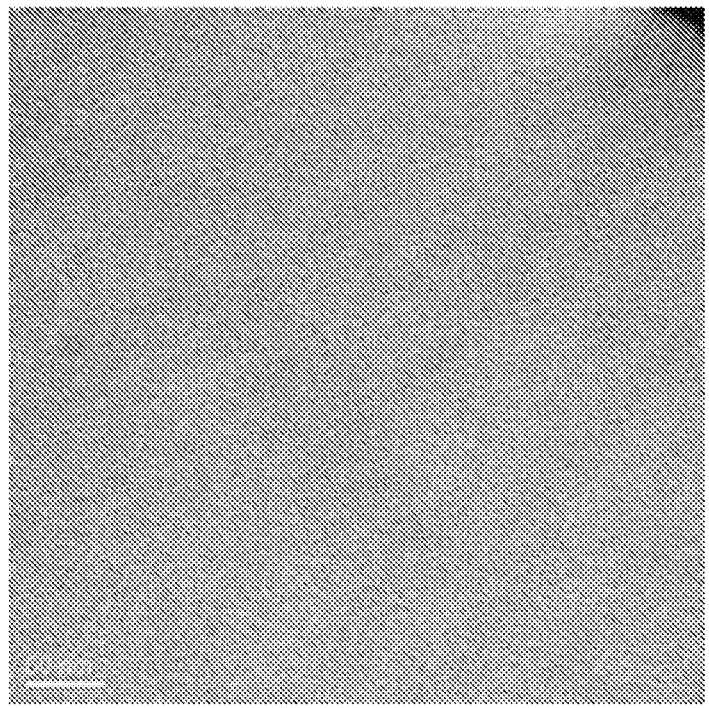
FIG. 1 is a photograph by field-emissions type transmission electron microscopy observation, which shows fine structure of the cured film obtained by photo-curing the photo-curable nanoimprint composition of the present invention used in Example 1.

In the present invention, the partial hydrolysate (A) is selected from a group consisting of (A-1) mixture of partial hydrolysate of organic silicon compound having a general formula (1):

[Ka 4]

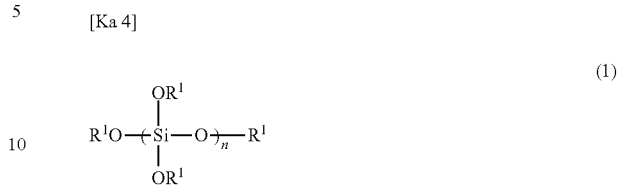

(wherein, each of ($R^1$)s is, same or different, C1-4 alkyl group; n is an integer of 1-10) and partial hydrolysate of (meth)acrylic group-containing silicon compound having a general formula (2):

[Ka 5]

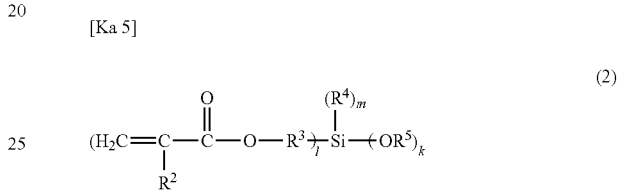

(wherein $R^2$ is hydrogen atom or methyl group; $R^3$ is C1-10 alkylene group, C3-10 cycloalkylene group, or C3-10 polymethylene group; $R^4$ is C1-4 alkyl group, C3-4 cycloalkyl group, or C6-12 aryl group; $R^5$ is C1-4 alkyl group or C3-4 cycloalkyl group; l is an integer of 1-3, m is an integer of 0-2, and k is an integer of 1-3, but (l+m+k) is 4; in case that each of $R^2$, $R^3$, $R^4$ and $R^5$ is present in plural, each of ($R^2$)s, ($R^3$)s, ($R^4$)s and ($R^5$)s may be same or different);

(A-2) mixture of partial hydrolysate of fluorinated organic silane compound having a general formula (3):

[Ka 6]

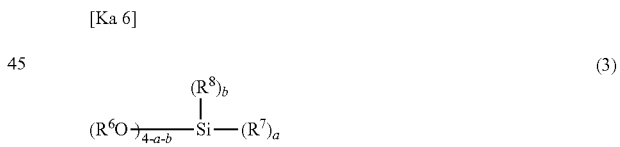

(wherein each of $R^6$ and $R^8$ is C1-10 alkyl group or C3-10 cycloalkyl group; $R^7$ is C1-100 fluorine-containing alkyl group, fluorine-containing cycloalkyl group, or fluorine-containing alkoxy ether group; a is an integer of 1-3 and b is an integer of 0-2, but (a+b) is 1-3; in case that each of $R^6$, $R^7$ and $R^8$ is present in plural, each of ($R^6$)s, ($R^7$)s and ($R^8$)s may be same or different) and said partial hydrolysate of (meth) acrylic group-containing silicon compound having the general formula (2); and (A-3) mixture of said partial hydrolysate of organic silicon compound having the general formula (1), said partial hydrolysate of (meth)acrylic group-containing silicon compound having the general formula (2), and said partial hydrolysate of fluorinated organic silane compound having the general formula (3).

Organic Silicon Compound

In the present invention, the organic silicon compound having the general formula (1):

[Ka 7]

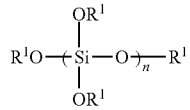

(1)

(wherein, each of ($R^1$)s is, same or different, C1-4 alkyl group; n is an integer of 1-10) is used (hereinafter, it is simply referred to as "organic silicon compound"). Using the organic silicon compound, it is possible to improve the etching resistance against oxygen gas.

As $R^1$ in the general formula (1), there can be exemplified methyl, ethyl, propyl, isopropyl, butyl, sec-butyl, isobutyl, tert-butyl groups, and among them, methyl, ethyl, propyl, isopropyl, or bytyl group is preferable. Though alkoxy group represented by —$OR^1$ produces an alcohol deriving from $R^1$ in hydrolysis, the photo-curable nanoimprint composition of the present invention may contain the alcohol. For that reason, considering that the alcohol should be the one which can easily be mixed with other components and can easily be removed after forming a coating film on substrata, in particular, $R^1$ is preferably C1-4 alkyl group such as methyl, ethyl, propyl, isopropyl, butyl group, etc.

If n in the general formula (1) satisfies the condition that it is an integer in the range of 1-10, the organic silicon compound may be single compound or a mixture of a plurality of organic silicon compounds having different value of n. In case of using single compound, the value of n is preferably 2-10, more preferably 3-7, considering transcription of pattern with lower pressure and transcription of fine pattern of 100 nm or less. On the other hand, in case of using the mixture of a plurality of organic silicon compounds, the mean value of n is preferably 1.1-10. Moreover, considering transcription of pattern with lower pressure and transcription of fine pattern of 100 nm or less the mean value of n is preferably 2-10, more preferably 3-7.

As the organic silicon compound, there can be exemplified tetramethoxysilane, tetraethoxysilane, tetrapropoxysilane, tetrabutoxysilane, and polycondensates thereof. Among them, tetramethoxysilane, tetraethoxysilane, and polycondensates thereof are preferable, because they produce an alcohol which can easily be removed after forming a coating film, or for a reason of reactivity, etc. Especially, polycondensate of tetramethoxysilane or tetraethoxysilane having the value of n or mean value of n of 3-7 is preferable.

(Meth)Acrylic Group-Containing Silicon Compound

In the present invention, (meth)acrylic group-containing silicon compound having the general formula (2):

[Ka 8]

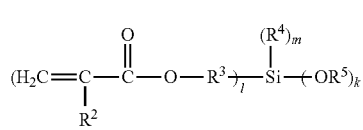

(2)

(wherein $R^2$ is hydrogen atom or methyl group; $R^3$ is C1-10 alkylene group, C3-10 cycloalkylene group, or C3-10 poly- methylene group; $R^4$ is C1-4 alkyl group, C3-4 cycloalkyl group, or C6-12 aryl group; $R^5$ is C1-4 alkyl group or C3-4 cycloalkyl group; l is an integer of 1-3, m is an integer of 0-2, and k is an integer of 1-3, but (l+m+k) is 4; in case that each of $R^2$, $R^3$, $R^4$ and $R^5$ is present in plural, each of ($R^2$)s, ($R^3$)s, ($R^4$)s and ($R^5$)s may be same or different) is used (hereinafter, it is simply referred to as "(meth)acrylic group-containing silicon compound"). Using the (meth)acrylic group-containing silicon compound, it is possible to provide the following results: it is possible to improve the etching resistance against oxygen gas; it is possible to obtain a photo-curable nanoimprint composition having excellent dispersibility and accordingly the purification by filtration becomes easy and productivity can be improved. Also, in the fine structure of cured film obtained by photo-curing, the inorganic component and the organic component are relatively homogeneously dispersed (that is, the dispersing state in which the inorganic compound aggregates extremely is not caused). As a result, it is presumed that a uniform transcription pattern and a uniform remaining film can be formed and the variability in etching resistance becomes small.

In the general formula (2), $R^2$ is hydrogen atom or methyl group. Among them, hydrogen atom is preferable, because the photo-curing rate is fast on curing the photo-curable nanoimprint composition.

$R^3$ is C1-10 alkylene group, C3-10 cycloalkylene group, or C3-10 Polymethylene group. In particular, there can be exemplified alkylene groups such as methylene, ethylene, propylene, isopropylene, butylene, isobutylene, sec-butylene, tert-butylene, 2,2-dimethylpropylene, 2-methylbutylene, 2-methyl-2-butylene, 3-methylbutylene, 3-methyl-2-butylene, pentylene, 2-pentylene, 3-pentylene, 3-dimethyl-2-butylene, 3,3-dimethylbutylene, 3,3-dimethyl-2-butylene, 2-ethylbutylene, hexylene, 2-hexylene, 3-hexylene, 2-methylpentylene, 2-methyl-2-pentylene, 2-methyl-3-pentylene, 3-methylpentylene, 3-methyl-2-pentylene, 3-methyl-3-pentylene, 4-methylpentylene, 4-methyl-2-pentylene, 2,2-dimethyl-3-pentylene, 2,3-dimethyl-3-pentylene, 2,4-dimethyl-3-pentylene, 4,4-dimethyl-2-pentylene, 3-ethyl-3-pentylene, heptylene, 2-heptylene, 3-heptylene, 2-methyl-2-hexylene, 2-methyl-3-hexylene, 5-methylhexylene, 5-methyl-2-hexylene, 2-ethylhexylene, 6-methyl-2-heptylene, 4-methyl-3-heptylene, octylene, 2-octylene, 3-oxtylene, 2-propylpentylene, 2,4,4-trimethylpentylene, etc.; cycloalkylene groups such as cyclopropylene, cyclobutylene, cyclopropylmethylene, cyclopentylene, cyclohexylene, cyclooctylene, etc.; polymethylene groups such as trimethylene, tetramethylene, pentamethylene, hexamethylene, heptamethylene, octamethylene, nonamethylene, decamethylene, etc.

Among them, C1-4 alkylene group or C3-4 polymethylene group such as methylene, ethylene, propylene, isopropylene, butylene, trimethylene, tetramethylene, etc. is preferable.

$R^4$ is C1-4 alkyl group, C3-4 cycloalkyl group, or C6-12 aryl group. In particular, there can be exemplified alkyl group such as methyl, ethyl, propyl, isopropyl, butyl, isobutyl, sec-butyl, tert-butyl, etc.; cycloalkyl group such as cyolopropyl, cyclobutyl, cyclopropylmethyl, etc.; aryl group such as phenyl, benzyl, 1-naphtyl, 2-naphtyl, o-methylnaphtyl, etc. Especially, methyl, ethyl is preferable.

$R^5$ is C1-4 alkyl group or C3-4 cycloalkyl group. In particular, there can be exemplified alkyl group such as methyl, ethyl, propyl, isopropyl, butyl, isobutyl, sec-butyl, tert-butyl, etc.; cycloalkyl group such as cyclopropyl, cyclobutyl, cyclopropylmethyl, etc.

Though alkoxy group represented by —$OR^5$ produces an alcohol deriving from $R^5$ in hydrolysis, the photo-curable nanoimprint composition of the present invention may contain the alcohol. For that reason, considering that the alcohol should be the one which can easily be mixed with other components and can easily be removed after forming a coating film on substrate, in particular, $R^5$ is preferably C1-4 alkyl group such as methyl, ethyl, propyl, isopropyl, butyl group, etc.

Preferably, l is 1, m is in the range of 0-2, and k is in the range of 1-3. But, the total of l, m and n, that is, (l+m+n) is 4.

As the (meth)acrylic group-containing silicon compound, there can be exemplified trimethoxysilylmethylene (meth) acrylate, trimethoxysilyldimethylene (meth)acrylate, trimethoxysilyltrimethylene (meth)acrylate, triethoxysilylmethylene (meth)acrylate, triethoxysilyldimethylene (meth) acrylate, triethoxysilyltrimethylene (meth)acrylate, tripropoxysilylmethylene (meth)acrylate, tripropoxysilylethylene (meth)acrylate, tripropoxysilyltrimethylene (meth) acrylate, tributoxysilylmethylene (meth)acrylate, tributoxysilyldimethylene (meth)acrylate, tributoxysilyltrimethylene (meth)acrylate, triisooropoxysilylmethylene (meth)acrylate, triisopropoxysilyldimethylene (meth)acrylate, triisopropoxysilyltrimethylene (meth)acrylate, dimethoxymethylsilylmethylene (meth)acrylate, dimethoxymethylsilyldimethylene (meth)acrylate, dimethoxymethylsilyltrimethylene (meth)acrylate, diethoxymethylsilylmethylene (meth)acrylate, diethoxymethylsilyldimethylene (meth)acrylate, diethoxymethylsilyltrimethylene (meth)acrylate, dimethoxyethylsilylmethylene (meth)acrylate, dimethoxyethylsilyldimethylene (meth)acrylate, dimethoxyethylsilyltrimethylene (meth)acrylate, diethoxyethylsilylmethylene (meth)acrylate, diethoxyethylsilyldimethylene (meth)acrylate, diethoxyethylsilyltrimethylene (meth)acrylate, methoxydimethylsilylmethylene (meth)acrylate, methoxydimethylsilyldimethylene (meth)acrylate, methoxydimethylsilyltrimethylene (meth)acrylate, ethoxydimethylsilylmethylene (meth)acrylate, ethoxydimethylsilyldimethylene (meth)acrylate, ethoxydimethylsilyltrimethylene (meth)acrylate, methoxydiethylsilylmethylene (meth) acrylate, methoxydiethylsilyldimethylene (meth)acrylate, methoxydiethylsilyltrimethylene (meth)acrylate, ethoxydiethylsilylmethylene (meth)acrylate, ethoxydiethylsilyldimethylene (meth)acrylate, ethoxydiethylsilyltrimethylene (meth)acrylate, etc. In particular, trimethoxysilyltrimethylene (meth)acrylate, triethoxysilyltrimethylene (meth)acrylate is preferable.

Blending Amount of Organic Silicon Compound and (Meth)Acrylic Group-Containing Silicon Compound In the present invention, the blending amount of organic silicon compound and (meth)acrylic group-containing silicon compound which constitute the mixture (A-1) used as the partial hydrolysate (A) is preferably as follows. That is, the mixture of partial hydrolysates (A-1) is preferably a product obtained by hydrolyzing a mixture which comprises 10-250 parts by mass of organic silicon compound and 3-300 parts by mass of (meth)acrylic group-containing silicon compound with respect to 100 parts by mass of plymerizable monomer (B) mentioned below. The molar amount of water which is used in the hydrolysis is in the range of not less than 0.1 times but less than 1.0 times with respect to the number of moles of all alkoxy groups present in the mixture.

In case that the blending amount of organic silicon compound and (meth)acrylic group-containing silicon compound is in the above-mentioned range, the mixture of partial hydrolysate (A-1) can be dispersed well in the photo-curable nanoimprint composition, the purification by filtration becomes easy, and the productivity can be improved. Also, since it is allowed to carry out the nanoimprint with a relatively low pressure, the duration of life of the used mold can be prolonged. Considering the dispersibility of partial hydrolysate and the nanoimprint with a relatively low pressure, the amount of organic silicon compound to be used is preferably in the range of 30-200 parts by mass and the amount of (meth)acrylic group-containing silicon compound to be used is preferably in the range of 10-250 parts by mass with respect to 100 parts by mass of polymerizable monomer (B). Moreover, the amount of organic silicon compound to be used is more preferably in the range of 30-150 parts by mass and the amount of (meth)acrylic group-containing silicon compound to be used is more preferably in the range of 10-200 parts by mass and the amount of organic silicon compound to be used is most preferably in the range of 35-130 parts by mass and the amount of (meth)acrylic group-containing silicon compound to be used is most preferably in the range of 15-180 parts by mass.

Expressing the above-described amounts with oxide equivalent, the amounts are as follows: the amount of organic silicon compound to be used is in the range of 3-100 parts by mass on silicon oxide conversion basis and the amount of (meth)acrylic group-containing silicon compound to be used is in the range of 1-80 parts by mass on silicon oxide conversion basis with respect to 100 parts by mass of polymerizable monomer (8) mentioned below.

Fluorinated Organic Silane Compound

In the present invention, fluorinated organic silane compound having the general formula (3):

[Ka 9]

(3)

(wherein each of $R^6$ and $R^8$ is C1-10 alkyl group or C3-10 cycloalkyl group; $R^7$ is C1-100 fluorine-containing alkyl group, fluorine-containing cycloalkyl group, or fluorine-containing alkoxy ether group; a is an integer of 1-3 and b is an integer of 0-2, but (a+b) is 1-3; in case that each of $R^6$, $R^7$ and $R^8$ is present in plural, each of $(R^6)$s, $(R^7)$s and $(R^8)$s may be same or different) is used (hereinafter, it is simply referred to as "fluorinated silane compound"). Using the fluorinated silane compound, it is possible to improve the release property from mold without impairing the adhesion between pattern and substrate.

In the general formula (3), $R^6$ and $R^9$ are C1-10 alkyl group or C3-10 cycloalkyl group, respectively. As examples of these groups, there can be e exemplified alkyl groups such as methyl, ethyl, propyl, isopropyl, butyl, sec-butyl, isobutyl, tert-butyl, etc.; cycloalkyl groups such as cyclopropyl, cyclobutyl, etc.

Though alkoxy group represented by —$OR^6$ produces an alcohol deriving from $R^6$ in hydrolysis, the photo-curable nanoimprint composition of the present invention may contain the alcohol. For that reason, considering that the alcohol should be the one which can easily be mixed with other components and can easily be removed after forming a coating film on substrate, in particular, $R^6$ is preferably C1-4 alkyl group such as methyl, ethyl, propyl, isopropyl, butyl group, etc.

$R^7$ is fluorine-containing alkyl group, fluorine-containing cycloalkyl group, or fluorine-containing alkoxy ether group. The term "fluorine-containing alkyl group" means that one or two or more hydrogen atoms of alkyl group are substituted with fluorine atom and similarly the "fluorine-containing cycloalkyl group" or "fluorine-containing alkoxy ether group" means that one or two or more hydrogen atoms of cycloalkyl group or alkoxy ether group are substituted with fluorine atom, respectively.

Especially, the fluorine-containing alkoxy ether group is the one obtaining by substituting one or two or more hydrogen atoms with fluorine atom in alkoxy ether group represented by a general formula (4)

[Ka 10]

(4)

(wherein, x is an integer of 1-10, y is an integer of 2-100).

In the general formula (4), x is preferably 1-6 and y is preferably 5-50.

Regarding $R^7$, C1-10 fluorine-containing alkyl group is preferable as the fluorine-containing alkyl group; C3-10 fluorine-containing alkoxy ether group is preferable as the fluorine-containing alkoxy ether group; and C3-10 fluorine-containing cycloalkyl group is preferable as the fluorine-containing cycloalkyl group.

In case that each of $R^6$, $R^7$ and $R^8$ is present in plural, each of $(R^6)$s, $(R^7)$s and $(R^8)$s may be same or different group.

As the fluorinated silane compound, there can be exemplified (heptadecafluoro-1,1,2,2-tetrahydrodecyl)-triethoxysilane, (heptadecafluoro-1,1,2,2-tetrahydrodecyl)-trimethoxysilane, nonafluorohexyltriethoxysilane, nonafluorohexyltrimethoxysilane, tridecafluoro-1,1,2,2-tetrahydrooctyl)-triethoxysilane, (tridecafluoro-1,1,2,2-tetrahydrooctyl)-trimethoxysilane, heptafluoro-1,1,2,2-tetrahydropentyl)-triethoxysilane, heptafluoro-1,1,2,2-tetrahydropentyl)-trimethoxysilane, (3,3,3-trifluoropropyl) dimethylethoxysilane, (3,3,3-trifluoropropyl) dimethylmethoxysilane, (3,3,3-trifluoropropyl) methyldiethoxysilane, (3,3,3-trifluoropropyl) methyldimethoxysilane, (3,3,3-trifluoropropyl) triethoxysilane, (3,3,3-trifluoropropyl)trimethoxysilane, perfluoropropyltriethoxysilane, perfluoropropyltrimethoxysilane, 5,5,6,6,7,7,8,8,9,9,10,10,10-tridecafluoro-2-(tridecafluorohexyl)decyltriethoxysilane, 5,5,6,6,7,7,8,8,9,9,10,10,10-tridecafluoro-2-(tridecafluorohexyl) decyltrimethoxysilane, perfluorododecyl-1H,1H,2H,2H-triethoxysilane, perfluorododecyl-1H,1H,2H,2H-trimethoxysilane, perfluorotetradecyl-1H,1H,2H,2H-triethoxysilane, perfluorotetradecyl-1H,1H,2H,2H-trimethoxysilane, 3-(per fluorocyclohexyloxy) propyltrimethoxysilane, etc.

As example of fluorinated silane compound having the general formula (4) in which $R^7$ is fluorine-containing alkoxy ether group, there can be exemplified a commercially available product Optool-DSX (tradename: DAIKIN INDUSTRIES, LTD.). In particular, considering that weak interaction between molecules and turbulence in molecule array structure, which are advantageous for surface detachability and ease of hydrolysis of alkoxy group represented by —$OR^6$, (tridacafluoro-1,1,2,2-tetrahydrooctyl)trimethoxysilane or (3,3,3-trifluoropropyl)trimethoxysilane is preferable.

Blending Amount of Fluorinated Silane Compound

In the present invention, in view of coexistence of adhesion to substrate and release property from mold, the blending amount of fluorinated silane compound is in the range of 0.001-4 parts by mass, preferably 0.01-3 parts by mass, more preferably 0.03-2 parts by mass, most preferably 0.05-1 parts by mass with respect to 100 parts by mass of plymerizable monomer (B) mentioned below.

Expressing the above-described amount with oxide equivalent, it is as follows: the amount of fluorinated silane compound is in the range of 0.001-2 parts by mass on silicon oxide conversion basis with respect to 100 parts by mass of polymerizable monomer (B) mentioned below.

Partial hydrolysate of metal alkoxide as an optional additive

In the present invention, the partial hydrolysate (A) may comprise, as an optional additive, partial hydrolysate of metal alkoxide having a general formula (S) [Ka 11]

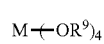
(5)

(wherein, M is zirconium or titanium and $(R^9)$s are same or different C1-10 alkyl group). Though the photo-curable nanoimprint composition of the present invention can form a coating film having excellent etching resistance against oxygen gas, in case of adding the metal alkoxide, the etching resistance against fluorine containing gas can be improved. The etching rate with oxygen gas can be adjusted by controlling the amount of metal alkoxide to be added.

In the general formula (5), M is preferably zirconium in order to enhance etching resistance.

$R^9$ is preferably C2-4 alkyl group in view of adequate hydlolysis rate.

Though, similarly to the above-mentioned organic silicon compound, alkoxy group represented by —$OR^9$ produces an alcohol deriving from $R^9$ in hydrolysis, the photo-curable nanoimprint composition of the present invention may contain the alcohol. For that reason, considering that the —$OR^9$ produces an alcohol which can easily be mixed with other components and can easily be removed after forming a coating film on substrate, in particular, $R^9$ is preferably C1-4 alkyl group such as ethyl, propyl, isopropyl, butyl group, etc.

As a suitable example of metal alkoxide , there can be exemplified tetramethyltitanium alkoxide, tetraethyl titanium alkoxide, tetraisopropyltitanium alkoxide, tetrapropyl titanium alkoxide, tetraisobutyltitanium alkoxide, tetrabutyltitanium alkoxide, tetrapentyltitanium alkoxide, tetraheptyltitanium alkoxide, tetrahexyltitanium alkoxide, tetraheptyltitanium alkoxide, tetraoctyltitanium alkoxide, tetranonyltitanium alkoxide, tetradecyltitanium alkoxide, tetramethylzirconium alkoxide, tetraethylzirconium alkoxide, tetraisopropylzirconium alkoxide, tetrapropylzirconium alkoxide, tetraisobutylzirconium alkoxide, tetrabutylzirconium alkoxide, tetrapentylzirconium alkoxide, tetrahexylzirconium alkoxide, tetraheptylzirconium alkoxide, tetraoctylzirconium alkoxide, tetranonylzirconium alkoxide, tetradecylzirconium alkoxide. In particular, tetraethylzirconium alkoxide, tetra isopropyl zirconium alkoxide, tetrapropylzirconium alkoxide , tetraisobutylzirconium alkoxide, tetrabutylzirconium alkoxide are preferable.

Blending Amount of Metal Alkoxide

In the present invention, considering the etching resistance against fluorine-containing gas, the blending amount of metal alkoxide is in the range of 1-50 parts by mass, preferably 3-40 parts by mass, more preferably 5-30 parts by mass, most preferably 10-30 parts by mass with respect to 100 parts by mass of plymerizable monomer (B) mentioned below.

The blending amount of metal alkoxide is preferably in the range of 0.2-100 parts by mass with respect to 100 parts by mass in total of two or more of hydrolysable compounds selected from the (meth)acrylic group-containing silicon compound, the organic silicon compound and the fluorinated silane compound. In case that the amount of metal alkoxide to be used is in the above-mentioned range, the etching resistance against fluorine-containing gas can specially be improved. For that reason, the amount of metal alkoxide to be used is preferably in the range of 2-50 parts by mass, more particularly the range of 5-30 parts by mass.

Expressing the above-described amount with oxide equivalent, it is as follows: the amount of metal alkoxide is in the range of 1-15 parts by mass on metal oxide conversion basis with respect to 100 parts by mass of polymerizable monomer (B) mentioned below.

Amount of water for hydrolysis

In the present invention, the molar amount of water which is used in the hydrolysis is in the range of not less than 0.1 times but less than 1.0 times with respect to the number of moles of all alkoxy groups present in the mixture of hyydrolysable compounds which comprises the organic silicon compound, the (meth)acrylic group-containing silicon compound and the fluorinated silane compound and the metal alkoxide. The "number of moles of all alkoxy groups" is calculated as follows: on each compound which is contained in the mixture, a product of the number of moles of used compound and the number of alkoxy groups present in one molecule of the compound is calculated and the obtained products are totaled.

In case that the amount of water is less than 0.1 mole times, it is not desirable, because the condensation of the mixture becomes insufficient and the "repelling" becomes easy to occur due to bad wetting of a coating film. On the other hand, in case of 1.0 mole times or more, it is not desirable, because it is hard to carry out the formation of pattern with a relatively low pressure and it causes the damage of mold. Considering the degree of condensation and the formation of pattern with a relatively low pressure, the molar amount of water is preferably in the range of 0.2-0.9 times, more preferably the range of 0.3-0.8 times with respect to the number of moles of all alkoxy groups present in the mixture.

In the present invention, in order to promote hydrolysis, an acid may be used together with water in hydrolysis. As the acid, there can be exemplified inorganic acids such as hydrochloric acid, nitric acid , sulfuric acid , phosphoric acid, polyphosphoric acid etc.; organic acids such as organic phosphoric acid, formic acid, acetic acid, acetic anhydride, chloroacetic acid, propionic acid, butyric acid, valeric acid, citric acid, gluconic acid, succinic acid, tartaric acid, lactic acid, fumaric acid, malic acid, itaconic acid, oxalic acid, mucic acid, uric acid, barbituric acid, p-toluenesulfonic acid, etc.; acidic cation-exchange resin. In case of using acid, though there is no particular limitation on the acid, it is preferably used in such molar amount that hydrogen ion is in the range of 0.0001-0.01 times with respect to the number of moles of all alkoxy groups. The acid can be used as it is, but it is preferable to use in the form of an aqueous solution or a dispersion in water. In this case , it is preferable to use the solution or dispersion having the concentration of 0.1-6 N. In this case, the used water is included in the above-mentioned amount of water for hydrolysis.

In the present invention, the partial hydrolysate (A) can be prepared by mixing the components which constitute the mixture with water. However, in order to prepare a homogeneous photo-curable nanoimprint composition, it is preferable to add water after the components to be hydrolyzed are previously mixed to form a mixture.

The mixture of partial hydrolysates (A-2) which is used as the partial hydrolysate (A) (that is, the mixture of partial hydrolysate of fluorinated silane compound having the general formula (3) and partial hydrolysate of (meth)acrylic group-containing silicon compound having the general formula (2)) can be prepared by hydrolyzing a mixture of the fluorinated silane compound having the general formula (3) and the (meth)acrylic group-containing silicon compound having the general formula (2) with water in the molar amount of 0.1 times or more but less than 1.0 times with respect to the number of moles of all alkoxy groups present in the mixture. In this case, if necessary, the metal alkoxide may be added to the mixture of the two components and may be subjected to the hydrolysis together with the components.

In the present invention, the blending amount of fluorinated silane compound and (meth) acrylic group-containing silicon compound which constitute the mixture (A-2) used as the partial hydrolysate (A) is preferably as follows. That is, the mixture of partial hydrolysates (A-2) is preferably a mixture of hydrolysates each of which is obtained by hydrolyzing 0.001-4 parts by mass of the fluorinated silane compound or 3-300 parts by mass of the (meth)acrylic group-containing silicon compound with respect to 100 parts by mass of polymerizable monomer (8) mentioned below.

The mixture of partial hydrolysates (A-3) which is used as the partial hydrolysate (A) (that is, the mixture of partial hydrolysate of organic silicon compound having the general formula (1), partial hydrolysate of (meth)acrylic group-containing silicon compound having the general formula (2) and partial hydrolysate of fluorinated silane compound having the general formula (3)) is a mixture which can be prepared by the steps of (i) preparing a mixture of partial hydrolysate of fluorinated silane compound having the general formula (3) and partial hydrolysate of (meth)acrylic group-containing silicon compound having the general formula (2) by hydrolyzing a mixture of the fluorinated silane compound having the general formula (3) and the (meth)acrylic group containing silicon compound having the general formula (2) with water in the molar amount of 0.1 times or more but less than 1.0 times with respect to the number of moles of all alkoxy groups present in the mixture; and (ii) adding the organic silicon compound having the general formula (1) to the mixture of partial hydrolysates prepared in the step (i) and then hydrolyzing the resulting mixture with water in the molar amount of 0.1 times or more but less than 1.0 times with respect to the number of moles of all alkoxy groups present in the mixture. In case that the mixture (A-3) comprises the partial hydrolysate of metal alkoxide, in the above-mentioned step (ii), the metal alkoxide may be added to the mixture of partial hydrolysates obtained by hydrolyzing the mixture of the fluorinated silane compound and the (meth)acrylic group-containing silicon compound together with the organic silicon compound having the general formula (1) and thus obtained mixture may be partially hydrolyzed.

The mixture of partial hydrolysates (A-3) can be prepared by hydrolyzing a mixture of the organic silicon compound having the general formula (1), the (meth)acrylic group-containing silicon compound having the general formula (2) and the fluorinated silane compound having the general formula (3) with water in the molar amount of 1.0 times or more but less than 1.0 times with respect to the number of moles of all alkoxy groups present in the mixture. In this case, if necessary, the metal alkoxide may be added to the mixture of the three components and may be subjected to the hydrolysis together with the components.

In the present invention, the blending amount of the organic silicon compound, the (meth)acrylic group-containing silicon compound and the fluorinated silane compound, which constitute the mixture (A-3) used as the partial hydrolysate (A), is preferably as follows. That is, the mixture of partial hydrolysates (A-3) is preferably a mixture of hydrolysates each of which is obtained by hydrolyzing separately 10-250 parts by mass of the organic silicon compound, 3-300 parts by mass of the (meth)acrylic group-containing silicon compound, or 0.001-4 parts by mass of the fluorinated silane compound with respect to 100 parts by mass of plymerizable monomer (B) mentioned below.

The hydrolysis may be carried out at the temperature of 5-35° C. At this time, in order to advance easily the hydrolysis, a diluent solvent may be used. It is preferable to use C1-4 alcohol, especially ethanol as the solvent for dilution. The amount of solvent to be used is preferably in the range of 50-400 parts by mass with respect to 100 parts by mass of the mixture.

Method of Use of Partial Hydrolysate (A) and Physical Property

The partial hydrolysate (A) can be prepared according to the method mentioned above. The photo-curable nanoimprint composition of the present invention may comprise alcohol which is by-produced in the hydrolysis and water which is used in the hydrolysis. Moreover, it may comprise the diluent solvent used to advance easily the hydrolysis.

Considering easiness of blending with other components and productivity of the photo-curable nanoimprint composition, the viscosity at 25° C. of the partial hydrolysate (A) is preferably in the range of 0.1-50 mPa sec. This value of viscosity is the one which is measured by a tuning-fork vibration type viscometer (AND VIBRO VISCOMETER SV-1A) and is obtained by measuring the photo-curable nanoimprint composition which comprises further the by-produced alcohol, the used water, and the diluent solvent which is used to dilute.

It is preferable to blend the partial hydrolysate with other components immediately after preparation to form the photo-curable nanoimprint composition. But, in case of not doing so, the partial hydrolysate after preparation i$ preferably preserved at the temperature of 0-15 ° C. to prevent deterioration with age. In this case, it is preferable also that the viscosity of the partial hydrolysate is in the above-described range.

Now, the polymerizable monomer having (meth)acrylic group (B) which constitutes the photo-curable nanoimprint composition of the present invention together with the partial hydrolysate prepared by the above-mentioned method will be explained.

Polymerizable Monomer Having (Meth)Acrylic Group (B)

In the present invention, there is no particular limitation on the polymerizable monomer having (meth)acrylic group (B) (or "polymerizable monomer (B)") and the known polymerizable monomers which are usable in photopolymerization can be used. But, the (meth)acrylic group-containing silicon compound having the general formula (2) is not included into the polymerizable monomer (B). As preferable compound, there can be exemplified polymerizable monomer which has (meth)acrylic group but no silicon atom in molecule. The polymerizable monomer (B) may be a monofunctional polymerizable monomer which has one (meth)acrylic group in one molecule or a polyfunctional polymerizable monomer which has two or more (meth)acrylic groups in one molecule. Also, these monofunctional polymerizable monomer and polyfunctional polymerizable monomer may be used in combination.

As an example of the polymerizable monomer (B), there can be exemplified as the monofunctional polymerizable monomer which has one (meth)acrylic group in one molecule, for example, aliphatic (meth)acrylates such as methyl (meth)acrylate, ethyl (meth)acrylate, propyl (meth)acrylate, n-butyl (meth)acrylate, isobutyl (meth)acrylate, tert-butyl (meth)acrylate, 2-ethylhexyl (meth)acrylate, isodecyl (meth) acrylate, isoamyl (meth)acrylate, isomyristyl (meth)acrylate, n-lauryl (meth)acrylate, n-stearyl (meth)acrylate, isostearyl (meth)acrylate, long-chain alkyl (meth)acrylate, n-butoxyethyl (meth)acrylate, butoxyethylene glycol (meth)acrylate, cyclohexyl (meth)acrylate, tetrahydrofurfuryl (meth)acrylate, butoxyethyl (meth)acrylate, 2-ethylhexyl-diglycol (meth)acrylate, dicyclopentenyl (meth)acrylate, dicyclopentenyloxyethyl (meth)acrylate, dicyclopentanyl (meth)acrylate, 2-hydroxyethyl (meth)acrylate, 2-hydroxypropyl (meth) acrylate, 2-hydroxybutyl (meth)acrylate, hydroxyethyl (meth)acrylate, 2-(2-hydroxyethoxy)ethyl (meth)acrylate, glycidyl (meth)acrylate, methoxyethylene glycol modified (meth)acrylate, ethoxyethylene glycol modified (meth)acrylate, propoxyethylene glycol modified (meth)acrylate, methoxypropylene glycol modified (meth)acrylate, ethoxypropylene glycol modified (meth)acrylate, propoxypropylene glycol modified (meth)acrylate, isobornyl (meth)acrylate, adamantane (meth)acrylate, acryloyl morpholine, etc.; and (meth)acrylates having aromatic ring such as benzyl (meth) acrylate, phenoxymethyl (meth)acrylate, phenoxyethyl (meth)acrylate, phenoxyethylene glycol modified (meth) acrylate, phenoxypropylene glycol modified (meth)acrylate, hydroxyphenoxyethyl (meth)acrylate, 2-hydroxy-3-phenoxypropyl (meth)acrylate, hydroxyphenoxyethylene glycol modified (meth)acrylate, hydroxyphenoxypropylene glycol modified (meth)acrylate, alkylphenolethylene glycol modified (meth)acrylate, alkylphenolpropylane glycol modified (meth)acrylate, ethoxylated o-phenylphenol (meth)acrylate, etc.

Among polyfunctional polymerizable monomer having two or more (meth)acrylic groups in one molecule, as bifunctional polymerizable monomer, for example, polymerizable monomers having alkyleneoxide bond in molecule are preferable. In particularly, there can be exemplified ethylene glycol di(meth)acrylate, propylene glycol di(meth)acrylate, polyolefin glycol di(meth)acrylate having a general formula (6):

[Ka 12]

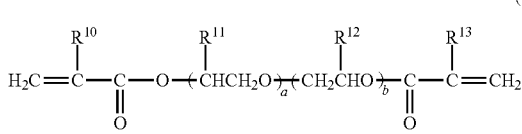

(6)

(wherein $R^{10}$, $R^{11}$, $R^{12}$ and $R^{13}$ are, independent from each other, hydrogen atom or methyl group; and a and b are an integer of not lower than 0 (zero), respectively, but the mean value of (a+b) is in the range of 2-25).

The polyolefin glycol di(meth)acrylate having the general formula (6) is usually prepared in the form of a mixture of molecules which are different from each other in molecular weight. For that reason, the value of (a+b) is a mean value. In order to enhance the effect of the present invention, the mean value of (a+b) is preferably in the range of 2 to 15, especially in the range of 2 to 10.

As other bifunctional polymerizable monomer, there can be exemplified aliphatic di(meth)acrylates such as ethoxylated polypropylene glycol di(meth)acrylate, 2-hydroxy-3-acryloyloxypropyl methacrylate, 2-hydroxy-1,3-dimethacryloxypropane, dioxane glycol di(meth)acrylate, tricyclodecanedimethanol di(meth)acrylate, 1,4-butanediol di(meth)acrylate, glycerine di(meth)acrylate, 1,6-hexanediol di(meth)acrylate, 1,9-nonanediol di(meth)acrylate, 1,10-decanediol di(meth)acrylate, neopentylglycol di(meth)acrylate, 2-methyl-1,8-octanediol di(meth)acrylate, 1,9-nonanediol di(meth)acrylate, butylethylpropanediol di(meth)acrylate, 3-methyl-1,5-pentanediol di(meth)acrylate, etc.; di(meth) acrylates having aromatic ring such as ethoxylated bisphenol A di(meth)acrylate, propoxylated ethoxylated bisphenol A di(meth)acrylate, ethoxylated bisphenol F di(meth)acrylate, etc.

As polyfunctional polymerizable monomer having three or more (meth)acrylic groups in one molecule, there can be exemplified ethoxylated glycerine tri(meth)acrylate, trimethylolpropane tri(meth)acrylate, ethoxylated trimethylolpropane tri(meth)acrylate, propoxylated trimethylolpropane tri(meth)acrylate, pentaerythritol tri(meth)acrylate, pentaerythritol tetra(meth)acrylate, di(trimethyrolpropane) tetra(meth)acrylate, ethoxylated pentaerythritol tetra(meth)acrylate, di(pentaerythritol) poly(meth)acrylate, etc.

In the present invention, these polymerizable monomers may be used alone or in combination depending on use, shape of pattern to be formed.

Especially, in case of using in the nanoimprint technology, it is preferable to use (meth)acrylate having aromatic ring in combination with polyolefin glycol di(meth)acrylate having the general formula (6) from the point of view of adhesion to substrate, etching resistance, uniformity of coating film, reduction of viscosity, etc. Moreover, as the (meth)acrylate having aromatic ring, mono(meth)acrylate having aromatic ring or di(meth)acrylate having aromatic ring or a mixture thereof may preferably be used.

Then, the photoinitiator (C) which constitutes the photo-curable nanoimprint composition of the present invention will be explained.

Photoinitiator (C)

In the present invention, there is no particular limitation on the photoinitiator (C) and any photoinitiator can be used provided that it may photoplymerize the polymerizable monomer (B).

As the photoinitiator, the following compounds can be suitably used: acetophenone derivatives such as 2,2-dimethoxy-1,2-diphenyl ethan-1-one, 1-hydroxycyclohexyl phenyl ketone, 2-hydroxy-2-methyl-I-phenylpropan-1-one, 1-[4-(2-hydroxyethoxy)-phenyl]-2-hydroxy-2-methyl-1-propan-1-one, 2-hydroxy-1-{4-[4-(2-hydroxy-2-methylpropionyl)-benzyl)-phenyl} -2-methyl-1-propan-1-one, phenylglyoxylic acid methyl ester, 2-methyl-1-[4-(methylthio) phenyl)-2-morpholinopropan-1-one, 2-benzyl-2-dirnethylamino-1-(4-morpholinophenyll-butanone-1, 2,2-dimethylamino-2-(4-methylbenzyl)-1-(4-morpholin-4-yl-phenyl) butan-1-one, etc.; acylphosphine oxide derivatives such as 2,4,6-trimethylbenzoyldiphosphine oxide, 2,6-dimethoxybenzoyldiphenyl phosphine oxide, 2,6-dichlorobenzoyldiphenylphosphine oxide, 2,4,6-trimetylbenzoylphenylphosphinic acid methyl ester, 2-methylbenzoyldiphenylphosphine oxide, pivaloylphenylphosphinic acid isopropyl ester, bis-(2,6-cichlorobenzoyl) phenylphosphine oxide, bis-(2,6-dichlorobenzoyl)-2,5-dimethylphenylphosphine oxide, bis-(2,6-dichlorobenzoyl)-4-propylphenylphosphine oxide, bis-(2,6-dichlorobenzoyl)-I-napthylphosphine oxide, bis-(2,6-dimethoxybenzoyl) phenylphosphine oxide, bis-(2,6-dimethoxybenzoyl)-2,4,4-trimethylpentylphosphine oxide, bis-(2,6-dimethoxybenzoyl)-2,5-cimethylphenylphosphine oxide, bis-(2,4, 6-trimethylbenzoyl)phenylphosphine oxide, bis-(2,5,6-trimethylbenzoyl)-2,4,4-trimethylpentylphosphine oxide, etc.; O-acyloxime derivatives such as 1,2-octanedione, 1-[4-(phenylthio)phenyl-,2-(O-benzoyloxime)], ethanone, 1-[9-ethyl-6-(2-methylbenzoyl)-9H-carbazol-3-yl],1-(Oacetyloxime), etc.; α-diketones such as diacetyl, acetylbenzoyl, benzyl,2,3-pentandione, 2,3-octandione, 4,4'-dimethoxybenzyl, 4,4'-dihydroxybenzyl, camphorquinone, 9,10-phenanthrenequinone, acenaphthenequinone, etc.; benzoin alkyl ethers such as benzoin methyl ether , benzoin ethyl ether , benzoin propyl ether , etc.; thioxanthone derivatives such as 2,4-diethoxythioxanthone, 2-chlorothioxanthone, methyl thiaxanthone, etc.; benzophenone derivatives such as benzophenone, p,p'-bis(dimethylaminolbenzophenone, p,p'-dimethoxybenzopehnone, etc.; titanocene derivatives such as bis-(n5-2,4-cyclopentadien-1-yl)-bis(2,6-difluoro-3-(1H-pyrol-1-yl)-phenyl)titanium, etc.

These photoinitiators may be used alone or in the form of a mixture of at least two members.

In case of using α-diketone, it is preferably used in combination with tertiary amine compound. As the tertiary amine compound usable in combination with α-diketone, there can be exemplified N,N-dimethylaniline, N,N-diethylaniline, N,N-di(n-butyl) aniline, N,N-dibenzylaniline, N,N-dimethyl-p-toluidine, N,N-diethyl-p-toluidine, N,N-dimethyl-m-toluidine, p-bromo-N,N-dimethylaniline, m-chloro-N,N-dimethylaniline, p-dimethylaminobenzaldehyde, p-dimethylaminoacetophenone, p-dimethylaminobenzoic acid, p -dimethylaminobenzoic acid ethyl ester, p-dimethylaminobenzoic acid amyl ester, N,N-dimethylanthranilic acid methyl ester, N,N-dihydroxyethylaniline, N,N-dihydroxyethyl-p-toluidine, p-dimethylaminophenetyl alcohol, p-dimethylaminostilbene, N,N-dimethyl-3,5-xylidine, 4-dimethylaminopylidine, N,N-dimethyl-α-naphthylamine, N,N dimethyl -β-naphthylamine, tributylamine, tripropylamine, triethylamine, N-methyldiethanolamine, N-ethyldiethanolamine, N,N-dimethylhexylamine, N,N-dimethyldodecylamine, N,N-dimethylstearylamine, N,N-dimethylaminoethyl methacrylate, N,N-diethylaminoethyl methacrylate, 2,2'-(n-butylimino)diethanol, etc.

In the present invention, it is preferable to use acetophenone derivatives, acylphosphine oxide derivatives, O-acyloxime derivatives, α-diketones.

In the present invention, the amount of photoinitiator to be used is preferably in the range of 1-10 parts by mass with respect to 100 parts by mass of the polymerizable monomer (B).

Other Additives in the Photo-Curable Nanoimprint Composition

The photo-curable nanoimprint composition of the present invention may comprise other additives provided that they do not affect adversely the effects of the present invention.

On using the photo-curable nanoimprint composition of the present invention, the photo-curable nanoimprint composition is used by applying it to a substrate. In this case, the photo-curable nanoimprint composition may be diluted by a solvent. For purpose of stabilizing the photo-curable composition of the present invention and for other purposes, a solvent may be added. There is no particular limitation on the solvent to be used and any solvent may be used provided that it can solve the photo-curable nanoimprint composition of the present invention. There can be exemplified, for example, acetonitrile, tetrahydrofuran, toluene, chloroform, ethyl acetate, methyl ethyl ketone, dimethylformamide, cyclohexanone, ethylene glycol, propylene glycol, propylene glycol methyl ether, propylene glycol monomethyl ether acetate, methyl-3-methoxypropionate, ethylene glycol monoethyl ether acetate, ethyl lactate, ethyl-3-ethoxypropionate, butyl acetate, 2-heptanone, methyl isobutyl ketone, acetylacetone, polyethylene glycol, water, alcohol. Water, alcohol may newly be added, or water which has been used in the preparation of partial hydrolysate and alcohol which has been by-produced in the preparation of partial hydrolysate may be used. Also, the solvent may contain the diluent solvent which has been used in the preparation of partial hydrolysate.

In case of using solvent, there is no particular limitation on the amount of solvent to be used and it can suitably be selected depending on thickness of coating film to be formed. Particularly, the amount of solvent is preferably selected such that the concentration of the solvent is in the range of 10-99% by mass, assuming that the total amount of the solvent and the photo-curable nanoimprint composition is 100% by mass.

The photo-curable nanoimprint composition of the present invention may comprise other known additives. Particularly, the additives such as surfactant, polymerization inhibitor, reactive diluent, etc. may be added. In view of uniformity of coating film, a surfactant may be added, and a polymerization inhibitor may be added in order to stabilize so that the polymerization is not caused during Preservation.

In case of using surfactant, it may be used at the ratio of 0.0001-0.1 parts by mass, preferably 0.0005-0.01 parts by mass with respect to 100 parts by mass of polymerizable monomer (B).

As surfactant, fluorine-containing surfactant, silicone based surfactant, aliphatic surfactant may be used. Especially, it is preferable to use aliphatic surfactant, because when the composition is applied to a substrate such as silicon wafer, "repelling" is not caused and the composition can be uniformly applied to the substrate. As example of surfactant, there can be exemplified anionic surfactants such as metal salts of higher fatty alcohol sulfate such as sodium decyl sulfate, sodium lauryl sulfate, etc., metal salts of aliphatic carboxylic acid such as sodium laurate, sodium stearate, sodium oleate, etc., metal salts of higher alkyl ether sulfate such as sodium lauryl ether sulfate (prepared by sulfating adduct of lauryl alcohol and ethylene oxide), etc., sulfosuccinic acid diesters such as sodium sulfosuccinate, etc., salts of phosphate of fatty alcohol ethylene oxide adduct, etc.; cationic surfactants such as alkyl amine salts such as dodecylammonium chloride, etc. and quaternary ammonium salts such as trimethyldodecylammonium bromide, etc.; amphoteric surfactants such as alkyldimethylamine oxides such as dodecyldimethylamine oxide, etc., alkylcarboxybetaines such as dodecylcarboxybetaine, etc., alkylsulfobetaines such as dodecylsulfobetaine, etc., amidoamino acid salts such as lauramidopropylamine oxide, etc.; nonionic surfactants such as polyoxyethylene alkyl ethers such as polyoxyethylene lauryl ether, etc., polyoxyalkylene alkyl ethers, polyoxyethylene distyrenated phenyl ethers, polyoxyethylene alkylpehnyl ethers such as polyoxyethylene laurylphenyl ether, etc., polyoxyethylene tribenzylphenyl ethers, fatty acid polyoxyethylene esters such as fatty acid polyoxyethylene laurate, polyoxyethylenesorbitan esters such as polyoxyethylenesorbitan laurate, etc. The respective surfactants may be used alone and if necessary, they may be used in combination of a plurality of types.

In case of using polymerization inhibitor, it may be need at the ratio of 0.01-1.0 parts by mass, preferably 0.1-0.5 parts by mass with respect to 100 parts by mass of polymerizable monomer (B).

As polymerization inhibitor, there can be exemplified the known compounds and as the most representative polymerization inhibitor, there can be exemplified hydroquinone monomethyl ether, hydroquinone, butylhydroxytoluene, etc.

As reactive diluent, there can be exemplified known compounds such as N-vinylpyrrolidone, etc.

There is no particular limitation on adding amount of reactive diluent. The amount of reactive diluent may suitably be selected from the range wherein the formation of pattern with a mold is not affected and can suitably be selected from the range of 1-50 parts by mass with respect to 100 parts by mass of polymerizable monomer (B). Particularly, considering the reduction of viscosity of the photo-curable nanoimprint composition, mechanical strength of pattern, etc., the adding amount of reactive diluent is preferably in the range of 5-30 parts by mass.

Also, as other additives, spherical fine particle such as hyperbranched polymers may be added. In this case, it is preferable to add the spherical hyperbranched polymer having the diameter of 1-10 nm, the molecular weight of 10,000-100,000. The blending amount is preferably in the range of 0.1-10 parts by mass with respect to 100 parts by mass of polymerizable monomer (B).

The photo-curable nanoimprint composition of the present invention can be prepared by blending the partial hydrolysate (A), the polymerizable monomer (B), the photoinitiator (C), and other additives which may be added in accordance with necessary. There is no particular limitation on order of addition of these ingredients.

Then, a method for forming a pattern on a substrate using the photo-curable nanoimprint composition prepared according to the above-mentioned method will be explained.

Method for Forming Pattern Using the Photo-Curable Nanoimprint Composition

First of all, a coating film is formed by applying the photo-curable nanoimprint composition which is prepared by the above-mentioned method according to a known method.

In relation to the substrate, there is no particular limitation on shape, material, and any substrate, sheet, film, etc. can be used. In particular, a known substrate, sheet or film such as silicon wafer, quartz, glass, sapphire, various metal materials, ceramics such as alumina, aluminum nitride, silicon carbide, silicon nitride, etc, polyethylene terephthalate film, polypropylene film, polycarbonate film, triacetylcellulose film, cycloolefin resin film. In order to improve the adhesion of substrate to cured film of the photo-curable nanoimprint composition of the present invention, the substrate may be subjected to a surface preparation.

A coating film can be formed by applying the photo-curable Nanoimprint composition of the present invention on the substrate by a known method such as spin coating, dipping, dispensing, ink-jet, roll-to-roll. There is no particular limitation on thickness of the costing film. The thickness can suitably be determined according to the intended use, but it is usually in the range of 0.1-5 µm. Also, the photo-curable nanoimprint composition of the present invention may suitably be used in formation of coating film having the thickness of 0.01-0.1 µm.

In order to form thin coating film, it is possible to dilute the photo-curable nanoimprint composition of the present invention with organic solvent. In that case, a drying step may suitably be incorporated in accordance with boiling point, volatility of the used organic solvent into the process for formation of pattern.

Then, a pattern-forming surface of mold, on which a desirable pattern has previously been formed, is brought into contact with the formed coating film. The mold is preferably made of transparent material such as quartz, transparent resin film in order to cure the applied composition via photoirradiation to form the cured film. The photo-curable nanoimprint composition of the present invention enables a pattern to be transcribed with a comparatively low pressure on pressing the mold against the cured film. There is no particular limitation on the pressure, but the pattern can be transcribed with the pressure of 0.01-1 MPa. Of course, it is possible to transcribe pattern with a pressure beyond upper limit of the range of pressure.

Thereafter, as remaining the situation of contacting the pattern-forming surface of mold with the coating film, a light is irradiated to cure the coating film. The light to be irradiated has the wave-length of up to 500 nm and the irradiation time is selected from the range of 0.1-300 seconds. It is usually in the range of 1-60 seconds but it may vary depending to the thickness of coating film.

In relation to atmosphere in which the photo-polymerization is carried out, the photo-polymerization may be carried out in the atmosphere, but it is preferable to conduct the photo-polymerization in an atmosphere in which inhibition due to oxygen is low, such as nitrogen gas atmosphere, inert gas atmosphere, fluorine gas atmosphere, vacuum atmosphere, etc.

After the photo-polymerization, a laminate having a pattern formed by the cured coating film (cured film) on the substrate is obtained by detaching the mold from the cured film.

Formation of Pattern in Substrate (Etching of Laminate Having Pattern Formed by Cured Film)

Using the photo-curable nanoimprint composition of the present invention, the formed cured film shows the excellent etching resistance. For that reason, the pattern formed by the cured film is extremely excellent in resistance against etching with oxygen gas, fluorine-containing gas, etc. and accordingly it can suitably be used in production of a substrate having nano-scale relief structure. As the fluorine-containing gas, it is possible to use known gas which can be used in reactive ion etching. In particular, there can be exemplified sulfur hexafluoride, fluoromethane, difluoromethane, trifluoromethane, tetrafluoromethane.

In a process for forming a pattern on the substrate which has, on its surface, the cured film to which a pattern has been transcribed with the mold, the pattern being formed on the substrate on the basis of the pattern of the cured film, first of all, the thin part of cured film (or "remaining film") is removed by dry etching to expose a surface of the substrate. Then, the zone of the substrate in which the remaining film is removed is subjected to dry etching or metal deposition. On the other hand, the zone of the substrate which is covered with thick part of the cured film is not dry-etched because of masking.

Use of Laminate on Which Pattern is Formed by Cured Film (Use as Replica Mold)

In accordance with the above-mentioned process, the pattern can be formed on the substrate by dry etching. However, the photo-curable nanoimprint composition of the present invention has superior performance characteristics and accordingly can be used in other intended use. For example, the cured film made of the photo-curable nanoimprint composition of the present invention has good hardness, because of good dispersion state of inorganic components. For that reason, the laminate comprising a substrate on which the pattern made of the cured film has been formed can be used as a replica mold for nanoimprint.

In case of using the laminate as a replica mold for nanoimprint, it is preferable to treat a surface of the laminate with a fluorine-containing silane coupling agent. The detachability of the surface of the laminate from other material can be improved by reaction with the silane coupling agent. It is considered that the improvement of detachability is caused by a reaction of silane coupling agent with alkoxy group remaining in the cured film to form chemically linkage. For that reason, the laminate obtained after the reaction with the silane coupling agent is still more excellent in release property.

As the silane coupling agent, known fluorine-containing silane agents can be used provided that they may improve the release property. In particular, there can be exemplified compounds which are obtained by substituting a part or all of hydrogen atoms of alkyl group in trihalogenated organic silane molecule or trialkoxy organic silane molecule with fluorine.

Though there is no particular limitation on the reaction between the silane coupling agent and the laminate, it is preferable to conduct the reaction under humid condition. In particular, the reaction is preferably conducted at the relative humidity of 40-100%. The silane coupling agent is come into contact with the laminate under humid condition to react them. Though there is no particular limitation on the temperature at which the reaction is conducted, it is preferably in the range of 40-80° C. As a process for contacting, in case of using liquid silane coupling agent, known processes such as soaking of the surface on which a pattern has been formed in the liquid, dip coat, spin coat, spray coat, etc. may be used. The reaction time may suitably be selected depending on the temperature and the relative humidity.

After being reacted with the silane coupling agent in accordance with the above-mentioned process, the laminate is washed with fluorine-containing solvent such as hydro fluoro ether, etc. and then is dried. Thus obtained laminate is superior in release property and can be used as a replica mold for nanoimprint.

EXAMPLE

Now, the present invention will be described in more detail by way of examples and comparative examples, but the present invention is not limited to these examples.

In the examples mentioned below, the photo-curable nanoimprint composition of the present invention is evaluated on the basis of the following properties.

Evaluation of Filterability

The photo-curable nanoimprint compositions which are prepared in the examples and the comparative examples mentioned below are treated as follows; using syringe filter having the pore diameter of 0.2 µmΦ and 10 ml syringe, 10 ml of the composition is manually filtered. The evaluation standards are shown below.

◯: It is completely filtered within 20 seconds.
Δ: It is completely filtered within one minute.
X: Clogging is cased and it is not filtered.

Evaluation of Adhesion of Cured Film to Substrate

Using the photo-curable nanoimprint composition, a photo-cured film is formed on a silicon wafer (P-type, one mirror-finished surface, no oxidized membrane). The cellophane tape 405 having the width of 15 mm (NICHIBAN CO., LTD.) is stuck to the photo-cured film through the force of pressure by three round trips of finger and then the cellophane tape is peeled. The adhesion of the cured film to the substrate is evaluated according to the following evaluation standards.

The cured film is not peeled at all: 5
The peeling area is less than 10%: 4
The peeling area is not less than 10% but less than 50%: 3
The peeling area is not less than 50% but less than 100%: 2
The peeling area is 100% (whole area is peeled): 1

Evaluation of Release Property From Mold

A silicon wafer (P-type, one mirror-finished surface, no oxidized membrane) having a coating film of the photo-curable nanoimprint composition is prepared by applying the photo-curable nanoimprint composition on the silicon wafer by spin coat and drying at 120° C. for 1 minute. Using a quartz plate, 20 mm long and 20 mm wide, as a mold, in the nanoimprinting apparatus (SANMEI ELECTRONICS CO. LTD.; ImpFlex Essential), the silicon wafer is pressurized with the pressure of 0.25 MPa and is irradiated with light from the light source LED 365 nm for 10 seconds to conduct the nanoimprint. The stress on dragging the quartz plate from the mold (releasing force) is measured to evaluate the release property from mold.

Evaluation of Transcription Property

The shape-transcription property of the pattern which is formed on the substrate by using the photo-curable nanoimprint composition is evaluated by observation with scanning electron microscope (SEM). The evaluation is conducted on the transcribed pattern comprising 15 lines having the width of 80 nm arranged at the space of 80 nm (hereinafter, it is referred to as "80 nm line/space"). The evaluation standards are shown below.

○: Pattern shape is completely transcribed.
Δ: Some defects of pattern shape are visible.
X: Pattern shape is not transcribed at all.

Evaluation of Etching Resistance

A photo-cured film of the photo-curable nanoimprint composition prepared in the example or the comparative example in formed on a silicon wafer (P-type, one mirror-finished surface, no oxidized membrane). Using a reactive ion etching apparatus, the dry etching with oxygen gas, $CHF_3$ gas is conducted under the conditions mentioned below. The dry etching rate (nm/min.) is calculated from the relation between the dry etching time and the decreasing amount of photo-cured film.

Conditions of the dry etching:
Oxygen gas: gas flow rate 50 sccm, RF power 100 W, control pressure 5.0 Pa
$CHF_3$ gas: gas flow rate 50 sccm, RF power 100 W, control pressure 2.0 Pa Example 1

Preparation of Partial Hydrolysate (A)

A mixture was prepared by blending 13.6 g of ethanol, 3.0 g of Trimethoxysilylpropyl acrylate as (meth)acrylic group-containing silicon compound, and 6.8 g of ethyl silicate 40 (COLCOAT CO., LTD.; on average, pentamer of tetraethoxysilane) as organic silicon compound. To the mixture, ethanol/water/2N—HCl mixture which consists of 4.25 g of ethanol, 0.85 g of water and 0.16 g of 2N—HCl was gradually added in drops at room temperature with stirring. Moreover, aqueous ethanol solution which consists of 1 g of ethanol and 0.32 g of water was added gradually in drops and the resulting mixture was stirred at room temperature for one hour to obtain a partial hydrolysate (a) of mixture of organic silicon compound and (meth)acrylic group-containing silicon compound.

Preparation of Photo-Curable Nanoimprint Composition

As the polymerizable monomer having (meth)acrylic group (B), 2.5 g of polyethylene glycol diacrylate (SHIN-NAKAMURA CHEMICAL CO., LTD.; NK ESTER A-200), 7.5 g of ethoxylated bisphenol A diacrylate (SHIN-NAKAMURA CHEMICAL CO., LTD.; NK ESTER A-BPE-10), 5.0 g of phenoxypolyethylene glycol acrylate (SHIN-NAKAMURA CHEMICAL CO., LTD.; NK ESTER AMP-10G), 5.0 g of hydroxyethylated o-phenylphenol acrylate (SHIN-NAKAMURA CHEMICAL CO., LTD.; NK ESTER A-LEN-10), and 5.0 g of tricyclodecanedimethanol diacrylate (SHIN-NAKAMURA CHEMICAL CO., LTD.; NK ESTER A-DCP) were used.

As the photoinitiator (C), 1.0 g of 2-dimethylamino-2-(4-methyl-benzyl)-1-(4-molpholin-4-yl-phenyl)-butan-1-one (BASF JAPAN LTD.; IRGACURE®379 EG) was used.

As the polymerization inhibitor, 0.0375 g of hydroquinone monomethyl ether and 0.005 g of butylhydroxytoluene were used.

The above-mentioned silicon compound having (meth)acrylic group (B), the photoinitiator (C) and the polymerization inhibitor were homogeneously blended to prepare a mixture and 4 g was weighed from the mixture. To 4 g of the mixture, 13.4 g of the partial hydrolysate (A) prepared as mentioned above was added and the resulting mixture was stirred at room temperature far 15 minutes to obtain the photo-curable nanoimprint composition. The blending ratio and the viscosity of the obtained photo-curable nanoimprint composition were shown in Table 1. The filterability of the photo-curable nanoimprint composition was evaluated as mentioned above and the result was shown in Table 2.

Confirmation of Dispersibility by FE-TEM

The obtained photo-curable nanoimprint composition was sandwiched between quartz plates, surface of which was subjected to release treatment, and was photo-cured to form a cured film. The obtained cured film was embedded in epoxy resin and subjected to cross-sectioning by ultramicrotome. Using a field-emission type transmission electron microscope, the FE-TEM observation of cross-section was conducted. The obtained photograph of cross-section was shown in FIG. 1. The photograph shown in FIG. 1 demonstrated that the cured film has uniform structure. Whereby, the dispersibility of the photo-curable nanoimprint composition was confirmed.

Application of Photo-Curable Nanoimprint Composition

The obtained photo-curable nanoimprint composition was diluted with 1-methoxy-2-propanol to adjust the concentration to be 25% by mass. The diluted photo-curable nanoimprint composition was applied on a silicon wafer (P-type, one mirror-finished surface, no oxidized membrane) by spin-coating at 2000 rpm for 30 seconds and then dried at 120° C. for 1 minute. Thus, the silicon wafer on which the coating film of the photo-curable nanoimprint composition was formed was obtained. The coating film was cured at the same condition (condition for photo-curing) as the condition for the formation of pattern mentioned below and the adhesion of the obtained cured film to the silicon wafer was evaluated under the above-mentioned conditions. The obtained result was shown in Table 2.

Formation of Pattern (Formation of Laminate)

Using a quartz mold with 80 nm line/space (NTT-AT NANOFABRICATION LTD.; 80L RESO;), in a nanoimprinting apparatus (SANMEI ELECTRONICS CO., LTD.; ImpFlex Essential), the obtained silicon wafer having the coating film of the photo-curable nanoimprint composition was pressurized with the pressure of 0.5 MPa and was irradiated with light from the light source LED 365 nm for 10 seconds to conduct the nanoimprint. The used quartz mold was previously subjected to release treatment with fluorine-containing surface preparation agent (DAIKIN INDUSTRIES LTD.; Optool-DSX). The shape of pattern transcribed after the light nanoimprint was observed by SEM. The obtained result on evaluation of transcription property was shown in Table 2.

Evaluation of Dry Etching Resistance

Using a reactive ion etching apparatus, the dry etching with oxygen gas, $CHF_3$ gas was conducted. The dry etching rate (nm/min.) on each gas was calculated from the relation between the etching time and the decreasing amount of photo-cured film. The obtained result was shown in Table 3.

Example 2

Preparation of Partial Hydrolysate (A)

A mixture was prepared by blending 13.6 g of ethanol, 3.0 g of trimethoxysilylpropyl acrylate as (meth)acrylic group-containing silicon compound, 6.8 g of ethyl silicate 40 (COLCOAT CO., LTD.; on average, pentamer of tetraethoxysilane) as organic silicon compound, and 1.7 g of 85% by mass solution of zirconium butoxide (tetrabutylzirconium alkoxide) in 1-butanol. To the mixture, ethanol/water/2N—HCl mixture which consists of 4.25 g of ethanol, 0.85 g of water and 0.16 g of 2N—HCl was gradually added in drops at room temperature with stirring. Moreover, aqueous ethanol solution which consists of 1 g of ethanol and 0.46 g of water was added gradually in drops and the resulting mixture was stirred at room temperature for one hour to obtain a partial hydrolysate (A) comprising organic silicon compound, (meth)acrylic group-containing silicon compound and metal alkoxide.

Preparation of Photo-Curable Nanoimprint Composition

The polymerizable monomer having (meth)acrylic group (B), the photoinitiator (C), and the polymerization inhibitor, the type and the amount of which are same as those used in Example 1, were blended to prepare a mixture. To a part of the mixture (4.0 g), 14.2 g of the above-mentioned partial hydrolysate (A) was added. The resulting mixture was stirred at room temperature for 15 minutes to prepare the photo-curable nanoimprint composition. The blending ratio and the viscosity of the obtained photo-curable nanoimprint composition were shown in Table 1. The filterability of the photo-curable nanoimprint composition was evaluated as mentioned above and the result was shown in Table 2.

Confirmation of Dispersibility by FE-TEM

Figure 2:
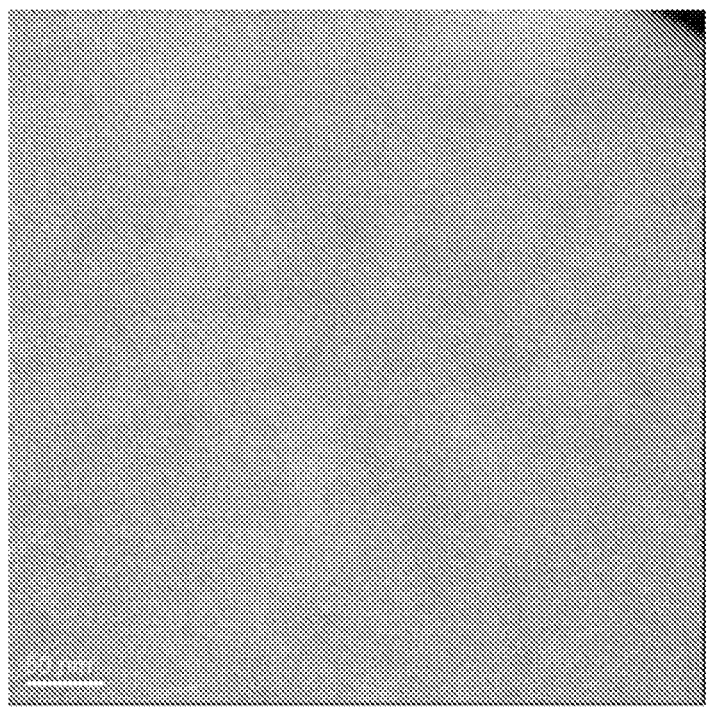
FIG. 2 is a photograph by field-emission type transmission electron microscopy observation, which shows fine structure of the cured film obtained by photo-curing the photo-curable nanoimprint composition of the present invention used in Example 2.

The FE-TEM observation of cross-section was conducted in the same manner as Example 1. The obtained photograph of cross-section was shown in FIG. 2. The photograph shown in FIG. 2 demonstrated that the cured film has fine, uniform structure of nano-scale. Whereby, the dispersibility of the photo-curable nanoimprint composition was confirmed.

Application of Photo-Curable Nanoimprint Composition

Operating in the same manner as Example 1, the silicon wafer having the coating film of the photo-curable nanoimprint composition was obtained. The adhesion of the cured film was shown in Table 2.

Formation of Pattern (Formation of Laminate)

Operating in the same manner as Example 1, the photo-nanoimprint and then the observation by SEM were conducted. The result of the evaluation of transcription property was shown in Table 2.

Evaluation of Dry Etching Resistance

The dry etching rate was calculated in the same manner as Example 1. The result was shown in Table 3.

Example 3

Operating in the same manner as Example 2 except modifying the amount of each ingredient as shown in Table 1, a partial hydrolysate (A) was prepared. Then, the photo-curable nanoimprint composition was prepared in the same manner as Example 1 except adding 24 g of the partial hydrolysate (A). The blending ratio and the viscosity were shown in Table 1. The filterability of the photo-curable nanoimprint composition was also evaluated as mentioned above and the result was shown in Table 2.

Operating in the same manner as Example 1, the application of the photo-curable nanoimprint composition and the formation of pattern were conducted and the adhesion and the transcription property of the obtained cured film were evaluated. The obtained results were shown in Table 2. The dry etching rate was calculated in the same manner as Example 1. The result was shown in Table 3.

Example 4

Using the same method as Example 2, a partial hydrolysate (A) was prepared. Then, the photo-curable nanoimprint composition was prepared in the same manner as Example 1 except adding 7.1 g of the partial hydrolysate (A). The blending ratio and the viscosity were shown in Table 1. The filterability of the photo-curable nanoimprint composition was also evaluated as mentioned above and the result was shown in Table 2.

Operating in the same manner as Example 1, the application of the photo-curable nanoimprint composition and the formation of pattern were conducted and the adhesion and the transcription property of the obtained cured film were evaluated. The obtained results were shown in Table 2. The dry etching rate was calculated in the same manner as Example 1. The result was shown in Table 3.

Example 5

Operating in the same manner as Example 1 except modifying the amount of water as shown in Table 1, a partial hydrolysate (A) was prepared. Then, the photo-curable nanoimprint composition was prepared in the same manner as Example 1 except adding 14.2 g of the partial hydrolysate (A). The blending ratio and the viscosity were shown in Table 1. The filterability of the photo-curable nanoimprint composition was also evaluated as mentioned above and the result was shown in Table 2.

Operating in the same manner as Example 1, the application of the photo-curable nanoimprint composition and the formation of pattern were conducted and the adhesion and the transcription property of the obtained cured film were evaluated. The obtained results were shown in Table 2. The dry etching rate was calculated in the same manner as Example 1. The result was shown in Table 3.

Example 6

Operating in the same manner as Example 1 except modifying the amount of water as shown in Table 1, a partial hydrolysate (A) was prepared. Then, the photo-curable nanoimprint composition was prepared in the same manner as Example 1 except adding 14.2 g of the partial hydrolysate (A). The blending ratio and the viscosity were shown in Table 1. The filterability of the photo-curable nanoimprint composition was also evaluated as mentioned above and the result was shown in Table 2.

Operating in the same manner as Example 1, the application of the photo-curable nanoimprint composition and the formation of pattern were conducted and the adhesion and the transcription property of the obtained cured film were evaluated. The obtained results were shown in Table 2. The dry etching rate was calculated in the same manner as Example 1. The result was shown in Table 3.

Example 7

Operating in the same manner as Example 2 except using 9.4 g of tetraethoxysilane in stead of ethyl silicate 40 and modifying the amount of water as shown in Table 1, a partial hydrolysate (A) was prepared. Then, the photo-curable nanoimprint composition was prepared in the same manner as Example 1 except adding 15.6 g of the partial hydrolysate (A). The blending ratio and the viscosity were shown in Table 1. The filterability of the photo-curable nanoimprint composition was also evaluated as mentioned above and the result was shown in Table 2.

Operating in the same manner as Example 1, the application of the photo-curable nanoimprint composition and the formation of pattern were conducted and the adhesion and the transcription property of the obtained cured film were evaluated. The obtained results were shown in Table 2. The dry etching rate was calculated in the same manner as Example 1. The result was shown in Table 3.

Example 8

Operating in the same manner as Example 2 except using 3.2 g of trimethoxysilylpropyl methacrylate in stead of trimethoxysilylpropyl acrylate and modifying the amount of water as shown in Table 1, a partial hydrolysate (A) was prepared. Then, the photo-curable nanoimprint composition was prepared in the same manner as Example 1 except adding 14.2 g of the partial hydrolysate (A). The blending ratio and the viscosity were shown in Table 1. The filterability of the photo-curable nanoimprint composition was also evaluated as mentioned above and the result was shown in Table 2.

Operating in the same manner as Example 1, the application of the photo-curable nanoimprint composition and the formation of pattern were conducted and the adhesion and the transcription property of the obtained cured film were evaluated. The obtained results were shown in Table 2. The dry etching rate was calculated in the same manner as Example 1. The result was shown in Table 3.

Example 9

Operating in the same manner as Example 2, the silicon wafer having the costing film of the photo-curable nanoimprint composition was prepared and the obtained wafer was subjected to a photo-nanoimprint. Thus obtained silicon wafer which has the cured film having the transcribed pattern (laminate) was used in a preparation of nanoimprint replica mold. The silicon wafer was cut to the size of 20 mm×20 mm around the pattern. Then, as a pre-treatment for mold release treatment, the hydrolyzing treatment of the surface of pattern was conducted under a humidification condition. The hydrolyzing treatment was conducted as follows: The cut silicon wafer (laminate) is put in an oven and besides a vessel containing water is put in the oven. While preventing the laminate from coming directly into contact with water, the oven is closed and the laminate is heated at 70° C. for one hour. Thereafter, in order to conduct the mold release treatment, the pattern surface of the pre-treated laminate is come into contact with a fluorine-containing surface preparation agent (DAIKIN INDUSTRIES, LTD.; Optool-DSX) to prepare a replica mold.

On the fluorine-treated pattern-transcribing surface, the mixture prepared in Example 1, which consists of the polymerizable monomer having (meth)acrylic group (B), the photoinitiator (C) and the polymerization inhibitor, was dropped and was covered with a quarts plate. Then, in a nanoimprinting apparatus (ENGINEERING SYSTEM CO., LTD.; EUN-4200), the obtained assembly was subjected to a photo-nanoimprint by pressurizing at the pressure of 0.3 MPa and irradiating the mixture with light from the side of quartz plate for 60 seconds by the light source LED 375 nm. After peeling off the quartz plate, the SEM observation of the obtained pattern surface was conducted, whereby it was confirmed that the same pattern as that of the used mold was transcribed.

Comparative Example 1

To 2.0 g of the mixture prepared in Example 1, which consists of the polymerizable monomer having (meth)acrylic group (B), the photoinitiator (C) and the polymerization inhibiter, 1.98 g of the surface-treated organosilica sol (NISSAN CHEMICAL INDUSTRIES, LTD., MEK-AC-2101, mean particle size: 10-15 nm, solid content: 30% by mass) was added and the resulting mixture was stirred at room temperature for 15 minutes to prepare a photo-curable nanoimprint composition. The blending ratio and the viscosity of the obtained photo-curable nanoimprint composition were shown in Table 1. The filterability of the photo-curable nanoimprint composition was also evaluated as mentioned above and the result was shown in Table 2.

Figure 3:
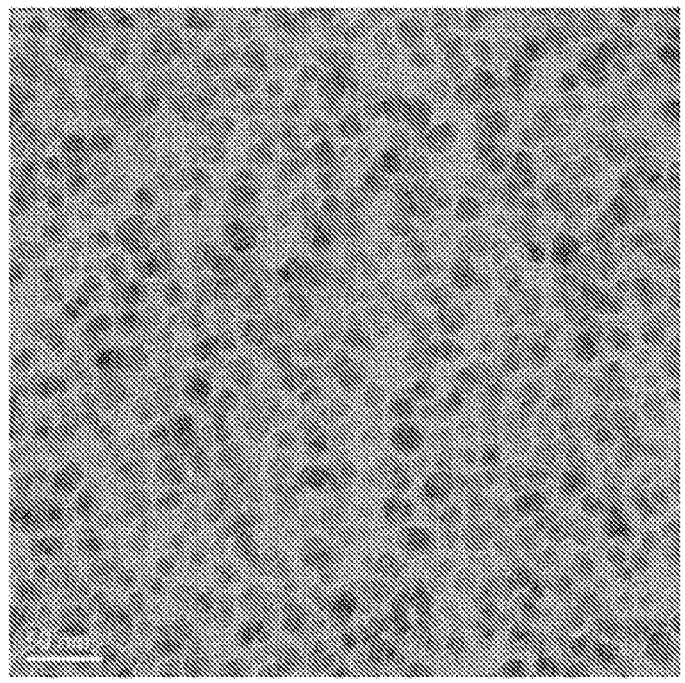
FIG. 3 is a photograph by field-emission type transmission electron microscopy observation, which shows fine structure of the cured film obtained by photo-curing the photo-curable nanoimprint composition used in Comparative Example 1.

The FE-TEM observation of cross-section was conducted in the same manner as Example 1. The obtained photograph was shown in FIG. 3. In the photograph, circular structure of tens nm was observed. Operating in the same manner as Example 1, the application of the photo-curable nanoimprint composition and the formation of pattern were conducted and the adhesion and the transcription property of the obtained cured film were evaluated. The obtained results were shown in Table 2. The dry etching rate was calculated in the same manner as Example 1. The result was shown in Table 3.

Comparative Example 2

The polymerizable monomer having (meth)acrylic group (B), the photoinitiator (C), and the polymerization inhibitor, the type and the amount which are same as those used in the Comparative Example 1, were blended to prepare a mixture. After adding 1.98 g of the surface-treated organosilica sol (NISSAN CHEMICAL INDUSTRIES, LTD., MEK-AC-2101, mean particle size: 10-15 nm, solid content: 30% by mass) and 0.23 g of surface-treated organic zirconia sol in the type of dispersing in organic solvent (NISSAN CHEMICAL INDUSTRIES, LTD., OZ-S30K-AC, particle size: 9 nm, solid content: 20.5% by mass) to the mixture of the same amount (2.0 g), the resulting mixture was stirred at room temperature for 15 minutes to prepare a photo-curable nanoimprint composition. The blending ratio and the viscosity of the obtained photo-curable nanoimprint composition were shown in Table 1. The filterability of the photo-curable nanoimprint composition was also evaluated as mentioned above and the result was shown in Table 2.

Figure 4:
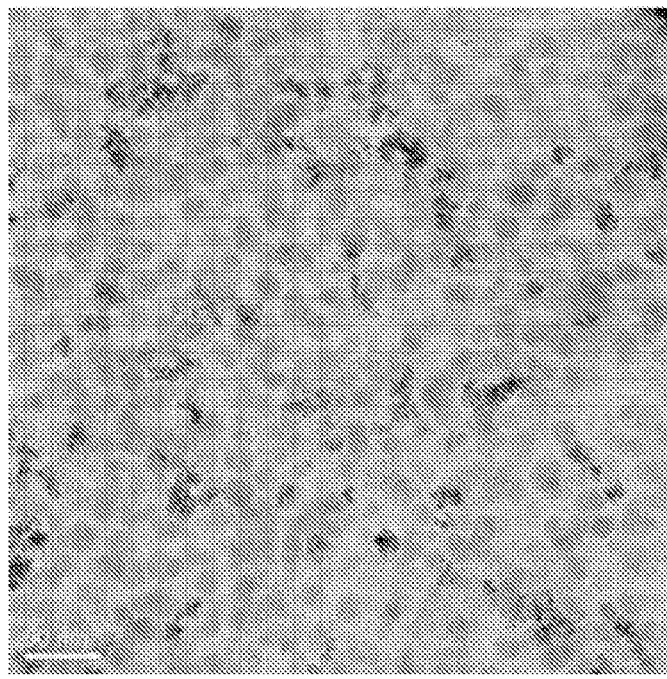
FIG. 4 is a photograph by field-emission type transmission electron microscopy observation, which shows fine structure of the cured film obtained by photo-curing the photo-curable nanoimprint composition used in Comparative Example 2.

The FE-TEM observation of cross-section was conducted in the same manner as Example 1. The obtained photograph of cross-section was shown in FIG. 4. In the photograph, circular armature of tens nm was observed. Operating in the same manner as Example 1, the application of the photo-curable nanoimprint composition and the formation of pattern were conducted and the adhesion and the transcription property of the obtained cured film were evaluated. The obtained results were shown in Table 2.

Comparative Example 3

Operating in the same manner as Example 1 except modifying the amount of water from 0.5 times mole to 1.0 times mole as shown in Table 1, a partial hydrolysate (A) was prepared. Then, the photo-curable nanoimprint composition was prepared in the same manner as Example 1 except adding 14.2 g of the partial hydrolysate (A). The blending ratio and the viscosity of the photo-curable nanoimprint composition were shown in Table 1. The filterability of the photo-curable nanoimprint composition was also evaluated as mentioned above and the result was shown in Table 2.

Operating in the same manner as Example 1, the application of the photo-curable nanoimprint composition and the formation of pattern ere conducted and the adhesion and the transcription property of the obtained cured film were evaluated. The obtained results were shown in Table 2. The transcription of pattern was not completed, probably because the coating film is stiff.

Comparative Example 4

Operating in the same manner as Example 1 except not using the partial hydrolysate (A), a photo-curable nanoimprint composition was prepared. The blending ratio and the viscosity of the obtained photo-curable nanoimprint composition were shown in Table 1. Operating in the same manner as Example 1, the application of the photo-curable nanoimprint composition and the formation of pattern were conducted and the adhesion and the transcription property of the obtained cured film were evaluated. The obtained results were shown in Table 2. The dry etching rate was calculated in the same manner as Example 1. The result was shown in Table 3.

Comparative Example 5

Operating in the same manner as Example 1 except not blending (meth)acrylic group-containing silicon compound, a partial hydrolysate was prepared from organic silicon compound only. Then, a photo-curable nanoimprint composition was prepared in the same manner as Example 1 except adding 10.0 g of the partial hydrolysate. The blending ratio and the viscosity of the photo-curable nanoimprint composition were above in Table 1. The filterability of the photo-curable nanoimprint composition was also evaluated as mentioned above and the result was shown in Table 2.

The FE-TEM observation of cross-section was conducted in the same manner as Example 1. The obtained photograph of cross-section was shown in FIG. 5. In the photograph, circular structure of tens nm was observed. Operating in the same manner as Example 1, the application of the photo-curable nanoimprint composition and the formation of pattern were conducted and the adhesion and the transcription property of the obtained cured film were evaluated. The obtained results were shown in Table 2. The transcription of patterns was not completed, probably because the coating film is stiff.

Comparative Example 6

A mixture was prepared by blending 13.6 g of ethanol, 3.0 g of 2-hydroxyethyl acrylate (KYOEI CHEMICAL CO., LTD,., LIGHT ESTER HOA), and 9.4 g of tetraethoxysilane. To the mixture, ethanol/water/2N—HCl mixture which consists of 4.25 g of ethanol, 0.87 g of water and 0.16 g of 2N—HCl was gradually added in drops at room temperature and the resulting mixture was stirred. Moreover, aqueous ethanol solution which consists of 1 g of ethanol and 0.61 g of water was added gradually in drops and the resulting mixture was stirred at room temperature for one hour to obtain a partial hydrolysate. Then, a photo-curable nanoimprint composition was prepared in the same manner as Example 1 except adding 12.9 g of the partial hydrolysate. The blending ratio and the viscosity of the photo-curable nanoimprint composition were shown in Table 1. The filterability of the photo-curable nanoimprint composition was also evaluated as mentioned above and the result was shown in Table 2.

Operating in the same manner as Example 1, the application of the photo-curable nanoimprint composition and the formation of pattern were conducted and the adhesion and the transcription property of the obtained cured film were evaluated. The obtained results were shown in Table 2.

TABLE 1

| | partical hydrolysate (A) | | | | | | | |
|---|---|---|---|---|---|---|---|---|
| | organic silicon compound parts by mass* | (meth)acrylic group-containing silicon compound parts by mass* | metal alkoxide parts by mass* | 2N—HCl parts by mass | amount of used water molar ratio** | polymerizable monomer (B) parts by mass | photoinitiator (C) parts by mass* | viscosity (mPa · sec) |
| Ex. 1 | 79.0 | 34.9 | — | 1.9 | 0.5 | 100 | 4 | 5 |
| Ex. 2 | 78.9 | 34.8 | 16.8 | 1.9 | 0.5 | 100 | 4 | 5 |
| Ex. 3 | 124 | 172 | 26.3 | 2.3 | 0.5 | 100 | 4 | 7 |
| Ex. 4 | 39.4 | 17.4 | 8.4 | 0.9 | 0.5 | 100 | 4 | 3 |
| Ex. 5 | 79.0 | 34.9 | — | 1.9 | 0.8 | 100 | 4 | 7 |
| Ex. 6 | 79.0 | 34.9 | — | 1.9 | 0.3 | 100 | 4 | 5 |
| Ex. 7 | 109 | 34.6 | 16.7 | 1.8 | 0.5 | 100 | 4 | 4 |
| Ex. 8 | 78.4 | 36.9 | 16.7 | 1.8 | 0.5 | 100 | 4 | 5 |
| Comparative Ex. 1 | — | — | — | — | — | 100 | 4 | 5 |
| Comparative Ex. 2 | — | — | — | — | — | 100 | 4 | 5 |
| Comparative Ex. 3 | 80.2 | 35.4 | — | 1.9 | 1.0 | 100 | 4 | 6 |
| Comparative Ex. 4 | — | — | — | — | — | 100 | 4 | 108 |
| Comparative Ex. 5 | 68.9 | — | — | 1.6 | 0.5 | 100 | 4 | 6 |
| Comparative Ex. 6 | 95.8 | 30.6*** | — | 1.6 | 0.5 | 100 | 4 | 6 |

*Blending amount (parts by mass) of each ingredient with respect to 100 parts by mass of polymerizable monomer
**Number of moles of used water with respect to the number of moles of all alkoxy groups (times) Inluding also water deriving from 2N—HCl
***Comparative example in which 2-hydroxyethyl acrylate is used.

TABLE 2

| | Evaluation of filterability | Evaluation of adhesion | Evaluation of transcription property |
|---|---|---|---|
| Ex. 1 | ○ | 5 | ○ |
| Ex. 2 | ○ | 5 | ○ |
| Ex. 3 | ○ | 5 | ○ |
| Ex. 4 | ○ | 4 | ○ |
| Ex. 5 | ○ | 5 | ○ |
| Ex. 6 | ○ | 4 | ○ |
| Ex. 7 | Δ | 5 | ○ |
| Ex. 8 | ○ | 5 | ○ |
| Comparative Ex. 1 | x | 1 | ○ |
| Comparative Ex. 2 | x | 1 | ○ |
| Comparative Ex. 3 | ○ | 5 | x |
| Comparative Ex. 4 | ○ | 1 | ○ |
| Comparative Ex. 5 | ○ | 3 | x |
| Comparative Ex. 6 | Δ | 5 | x |

TABLE 3

| | dry etching rate (nm/min) | |
|---|---|---|
| | oxygen gas | CHF$_3$ gas |
| Ex. 1 | 2 | 19 |
| Ex. 2 | 1 | 14 |
| Ex. 3 | 1 | 19 |
| Ex. 4 | 1 | 14 |
| Ex. 5 | 2 | 20 |
| Ex. 6 | 2 | 19 |
| Ex. 7 | 1 | 14 |
| Ex. 8 | 1 | 14 |
| Comparative Ex. 4 | 193 | 16 |

Example 10

Preparation of Partial Hydrolysate (A)

A mixture was prepared by blending 0.28 g of a solution prepared by diluting (3,3,3-trifluoropropyl)trimethoxysilane with ethanol to the solid content of 10% as fluorinated silane compound, 3.0 g of trimethoxysilyltrimethylene acrylate as (meth)acrylic group-containing silicon compound, and 13.6 g of ethanol. To the mixture, ethanol/water/2N—HCl mixture which consists of 1.63 g of ethanol, 0.31 g of water and 0.06 g of 2N—HCl was gradually added in drops and the resulting mixture was stirred at room temperature for one hour to obtain a partial hydrolysate in the form of mixture consisting of the fluorinated silane compound and the (meth)acrylic group-containing silicon compound. To the obtained partial hydrolysate, 6.8 g of ethyl silicate 40 (COLCOAT CO., LTD.; on average, pentamer of tetraethoxysilane) as organic silicon compound was added and ethanol/water/2N—HCl mixture which consists of 2.62 g of ethanol, 0.60 g of water and 0.10 g of 2N—HCl was added gradually in drops to the mixture at room temperature with stirring. Moreover, aqueous ethanol solution which consists of 1.00 g of ethanol and 0.28 g of water was added gradually in drops and the resulting mixture was stirred at room temperature for one hour to obtain a partial hydrolysate (A) comprising further a partial hydrolysate of organic silicon compound.

Preparation of Photo-Curable Nanoimprint Composition

The polymerizable monomer (B), the photoinitiator (C), and the polymerization inhibitor, respective of which are same as those used in Example 1, were blended to prepare a mixture and 2.0 g was weighed from the mixture. To the mixture (2.0 g), 5.6 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 3. The filterability of the photo-curable nanoimprint composition was evaluated as mentioned above and the result was shown in Table 5.

Operating in the same manner as Example 1, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 11

Preparation of Partial Hydrolysate (A)

A mixture was prepared by blending 0.28 g of a solution prepared by diluting (3,3,3-trifluoropropyl)trimethoxysilane with ethanol to the solid content of 10% as fluorinated silane compound, 3.0 g of trimethoxysilyltrilmethylene acrylate as (meth)acrylic group-containing silicon compound, and 13.6 g of ethanol. To the mixture, ethanol/water/2N—HCl mixture which consists of 1.63 g of ethanol, 0.31 g of water and 0.06 g of 2N—HCl was gradually added in drops and the resulting mixture was stirred at room temperature for one hour to obtain a partial hydrolysate in the form of mixture consisting of the fluorinated silane compound and the (meth)acrylic group-containing silicon compound. To the obtained partial hydrolysate, 6.8 g of ethyl silicate 40 (COLCOAT CO., LTD.; on average, pentamer of tetraethoxysilane) as organic silicon compound and 1.70 g of 85% by mass zirconium butoxide (tetrabutylzirconium alkoxide) solution in 1-butanol were added and to the resulting mixture, ethanol/water/2N—HCl mixture which consists of 2.62 g of ethanol, 0.66 g of water and 0.10 g of 1N—HCl was added gradually in drops at room temperature with stirring. Moreover, aqueous ethanol solution which consists of 1.00 g of ethanol and 0.37 g of water was added gradually in drops and the resulting mixture was stirred at room temperature for one hour to obtain a partial hydrolysate (A) comprising further the partial hydrolysate of organic silicon compounder and the partial hydrolysate of metal alkoxide.

Preparation of Photo-Curable Nanoimprint Composition

To 2.0 g of the homogeneous mixture used in the Example 10, which consists of the polymerizable monomer (B), the photoinitiator (C), and the polymerization inhibitor, respective of which are same as those, 7.0 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 12

Preparation of Partial Hydrolysate (A)

Operating in the same manner as Example 11 except modifying the amount of each ingredient as shown in Table 4, a partial hydrolysate (A) was prepared.

Preparation of Photo-Curable Nanoimprint Composition

To 2.0 g of the homogeneous mixture used in the Example 10, which consists of the polymerizable monomer (B), the photoinitiator (C), and the polymerization inhibitor, 12 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 13

Preparation of Partial Hydrolysate (A)

Operating in the same manner as Example 11 except modifying the amount of each ingredient as shown in Table 4, a partial hydrolysate (A) was prepared.

Preparation of Photo-Curable Nanoimprint Composition

To 2.0 g of the homogeneous mixture used in the Example 10, which consists of the polymerizable monomer (B), the photoinitiator (C), and the polymerization inhibitor, 3.6 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 14

Preparation of Partial Hydrolysate (A)

Operating in the same manner as Example 11 except using (tridecafluoro-1,1,2,2-tetrahydrooctyl)-triethoxysilane as fluorinated silane compound in stead of (3,3,3-trifluoropropyl)trimethoxysilane, using 0.66 g of a solution prepared by diluting the fluorinated silane compound with ethanol to the solid content of 10% and modifying the amount of water as shown in Table 4, a partial hydrolysate (A) was prepared.

Preparation of Photo-Curable Nanoimprint Composition

To 2.0 g of the homogeneous mixture used in the Example 10, which consists of the polymerizable monomer (B), the photoinitiator (C), and the polymerization inhibitor, 7.0 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 15

Preparation of Partial Hydrolysate (A)

Operating in the same manner as Example 11 except using (3,3,3-trifluoropropyl)methyldimethoxysilane as fluorinated silane compound in stead of (3,3,3-trifluoropropyl)trimethoxysilane and using 0.26 g of a solution prepared by diluting the fluorinated silane compound with ethanol to the solid content of 10%, a partial hydrolysate (A) was prepared.

Preparation of Photo-Curable Nanoimprint Composition

To 2.0 g of the homogeneous mixture used in Example 10, which conisists of the polymerizable monomer (B), the photoinitiator (C), and the polymerization inhibitor, 7.0 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 16

Preparation of Partial Hydrolysate (A)

Operating in the same manner as Example 11 except using 1.50 g of a solution prepared by diluting (3,3,3-trifluoropropyl)trimethoxysilane with ethanol to the solid content of 10%, a partial hydrolysate (A) was prepared.

Preparation of Photo-Curable Nanoimprint Composition

To 2.0 g of the homogeneous mixture of the polymerizable monomer (B), the photoinitiator (C), and the polymerization inhibitor, respective of which are same as those used in Example 10, 7.1 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was measured evaluated as mentioned above and the result was shown in Table 5.

Operating in the same manner as Example 10, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 17

Preparation of Partial Hydrolysate (A)

Operating in the same manner as Example 11 except using 0.028 g of a solution prepared by diluting (3,3,3-trifluoropropyl)trimethoxysilane with ethanol to the solid content of 10%, a partial hydrolysate (A) was prepared.

Preparation of Photo-Curable Nanoimprint Composition

To 2.0 g of the homogeneous mixture used in Example 10, which consists of the polymerizable monomer (B), the photoinitiator (C), and the polymerization inhibitor, 7.0 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 6.

Operating in the same manner as Example 10, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 10

Preparation of Partial Hydrolysate (A)

A mixture was prepared by blending 0.28 g of a solution prepared by diluting (3,3,3-trifluoropropyl)trimethoxysilane with ethanol to the solid content of 10% as fluorinated silane compound, 3.0 g of trimethoxysilylpropyl acrylate as (meth)acrylic group-containing silicon compound, 6.8 g of ethyl silicate 40 (COLCOAT CO., LTD.; on average, pentamer of tetraethoxysilane) as organic silicon compound, 1.70 g of 85% by mass zirconium butoxide (tetrabutylzirconium alkoxide) solution in 1-butanol, and 13.6 g of ethanol. To the mixture, ethanol/water/2N—HCl mixture which consists of 4.25 g of ethanol, 0.97 g of water and 0.16 g of 2N—HCl was gradually added in drops with stirring. Moreover, aqueous ethanol solution which consists of 1.00 g of ethanol and 0.37 g of water was added gradually in drops and the resulting mixture was stirred at room temperature for one hour to obtain a partial hydrolysate (A) comprising partial hydrolysates of the fluorinated silane compound, the organic silicon compound, the organic silicon compound and the metal alkoxide.

Preparation of Photo-Curable Nanoimprint Composition

To 2.0 g of the homogeneous mixture used in Example 10, which consists of the polymerizable monomer (B), the photoinitiator (C), and the polymerization inhibitor, 7.0 g of the above-mentioned partial hydrolysate (A) was added and the resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the transcription property and the release property of the obtained, cured film were evaluated. The obtained results were shown in Table 5. The dry etching rate was calculated in the same manner as Example 1. The result was shown in Table 6.

Example 19

Preparation of Partial Hydrolysate (A)

Operating in the same manner as Example 11 except using 3.2 g of trimethoxysilylpropyl methacrylate in stead of 3.0 g of trimethoxysilylpropyl acrylate and modifying the amount of water as shown in Table 4, a partial hydrolysate (A) was prepared.

Preparation of Photo-Curable Nanoimprint Composition

To 2.0 g of the homogeneous mixture used in Example 10, which consists of the polymerizable monomer (B), the photoinitiator (C), and the polymerization inhibitor, 7.1 g of the above-mentioned partial hydrolysate (A-3) was added. The resulting mixture was stirred at room temperature for 15 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the transcription property and the release property of the obtained cured film were evaluated. The obtained results were shown in Table 5. The dry etching rate was calculated in the same manner as Example 1. The result was shown in Table 6.

Example 20

Operating in the same manner as Example 1, the silicon wafer having the coating film of the photo-curable nanoimprint composition prepared in Example 11 was prepared and the obtained wafer was subjected to a photo-nanoimprint. Thus obtained silicon wafer which has the cured film having the transcribed pattern (laminate) was used in a preparation of nanoimprint replica mold. The silicon wafer was cut to the size of 20 mm×20 mm around the pattern. Then, as a pretreatment for mold release treatment, the hydrolyzing treatment of the surface of pattern was conducted under a humidification condition. The hydrolyzing treatment was conducted as follows: The cut silicon wafer (laminate) is put in an oven and besides a vessel containing water is put in the oven. While preventing the laminate from coming directly into contact with water, the oven is closed and the laminate is heated at 70° C. for one hour. Thereafter, in order to conduct the mold release treatment, the pattern surface of the treated laminate is come into contact with a fluorine-containing surface preparation agent (DAIKIN INDUSTRIES, LTD.; Optool-DSX) to prepare a replica mold.

On the fluorine-treated pattern-transcribing surface, the mixture prepared in Example 10, which consists of the polymerizable monomer having (meth)acrylic group (B), the photoinitiator (C) and the polymerization inhibitor, was dropped and was covered with a quartz plate. Then, in a nanoimprinting apparatus (ENGINEERING SYSTEM CO., LTD.; EUN-4200), the obtained assembly was subjected to a photo-nanoimprint by pressurizing at the pressure of 0.3 MPa and irradiating the mixture with light from the side of quartz plate aide for 60 seconds by the light source LED 375 nm. After peeling off the quartz plate, the obtained pattern surface was subjected to SEM observation, the SEM observation of the obtained pattern surface was conducted, whereby it was confirmed that the same pattern as that of the used mold was transcribed.

Comparative Example 7

This comparative example intends to show that the presence of fluorinated silane compound in the partial hydrolysate (A) of the present invention enables an improvement in release property of the obtainable photo-curable nanoimprint composition.

Preparation of Partial Hydrolysate (A)

A mixture was prepared by blending 13.6 g of ethanol, 3.0 g of trimethoxysilylpropyl acrylate as (meth)acrylic group-containing silicon compound, 6.8 g of ethyl silicate 40 (COLCOAT CO., LTD.; on average, pentamer of tetraethoxysilane) as organic silicon compound, and 1.7 g of 85% by mass solution of zirconium butoxide (tetrabutylzirconium alkoxide) in 1-butanol. To the mixture, ethanol/water/2N—HCl mixture which consists of 4.25 g of ethanol, 0.85 g of water and 0.16 g of 2N—HCl was gradually added in drops at room temperature with stirring. Moreover, aqueous ethanol solution which consists of 1 g of ethanol and 0.46 g of water was added gradually in drops and the resulting mixture was stirred at room temperature for one hour to obtain a partial hydrolysate (A) comprising the (meth)acrylic group-containing silicon compound, the organic silicon compound and the metal alkoxide. This partial hydrolysate corresponds to the mixture of partial ahydrolysates (A-1) of the present invention.

The polymerizable monomer (B), the photoinitiator (C), and the polymerization inhibitor, the type and amount which are same as those used in Example 10, were blended to prepare a mixture. After adding 7.0 g of the above-mentioned partial hydrolysate (A) to the mixture of the same amount (2.0 g), the resulting mixture was stirred at room temperature for 15 minutes to prepare a photo-curable nanoimprint composition. The blending ratio and the viscosity of the obtained photo-curable nanoimprint composition were shown in Table 4.

Operating in the same manner as Example 10, the application of the photo-curable nanoimprint composition and the formation of pattern were conducted and the adhesion, the release property and the transcription property of the obtained cured film were evaluated. The obtained results were shown in Table 5. The dry etching rate was calculated in the same manner as Example 1. The result was shown in Table 6.

Comparative Example 8

Preparation of Partial Hydrolysate

Operating in the same manner as Example 11 except not using the (meth)acrylic group-containing silicon compound, a partial hydrolysate was prepared.

Preparation of Photo-Curable Nanoimprint Composition

To 2.0 g of the homogeneous mixture used in Example 10, which consists of the polymerizable monomer (B), the photoinitiator (C), and the polymerization inhibitor, 5.0 g of the above-mentioned partial hydrolysate was added and the resulting mixture was stirred at room temperature for 10 minutes to prepare a photo-curable nanoimprint composition. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the release property and the transcription property of the obtained cured film were evaluated. The obtained results were shown in Table 5. The transcription of pattern was not completed, probably because the coating film is stiff.

Comparative Example 9

Preparation of Photo-Curable Nanoimprint Composition

Operating in the same manner as Example 10 except not using the partial hydrolysate, a photo-curable nanoimprint composition was prepared. The blending ratio and the viscosity of the obtained photo-curable nanoimprint composition were shown in Table 4. The filterability of the photo-curable nanoimprint composition was evaluated as mentioned above and the result was shown in Table 5.

Operating in the same manner as Example 10, the application of the photo-curable nanoimprint composition and the formation of pattern were conducted and the adhesion, the release property and the transcription property of the obtained cured film were evaluated. The obtained results were shown in Table 5. The dry etching rate was calculated in the same manner as Example 1. The result was shown in Table 6.

TABLE 4

| | partical hydrolysate(A) | | | | | | | | |
|---|---|---|---|---|---|---|---|---|---|
| | fluorinated organic silane compound parts by mass* | (meth)acrylic group-containing silicon compound parts by mass* | organic silicon compound parts by mass* | metal alkoxide parts by mass* | 2N—HCl parts by mass | amount of used water molar ratio** | polymerizable monomer (B) parts by mass | photoinitiator (C) parts by mass* | viscosity (mPa·sec) |
| Ex. 10 | 0.3 | 28.9 | 65.4 | — | 1.5 | 0.5 | 100 | 4 | 5 |
| Ex. 11 | 0.3 | 34.0 | 77.0 | 16.4 | 1.8 | 0.5 | 100 | 4 | 5 |
| Ex. 12 | 1.0 | 172 | 124 | 26.3 | 2.3 | 0.5 | 100 | 4 | 3 |
| Ex. 13 | 0.2 | 17.5 | 39.6 | 8.4 | 0.9 | 0.5 | 100 | 4 | 8 |
| Ex. 14 | 0.8 | 34.2 | 77.6 | 16.5 | 1.8 | 0.3 | 100 | 4 | 5 |
| Ex. 15 | 0.3 | 34.0 | 77.1 | 16.4 | 1.8 | 0.5 | 100 | 4 | 5 |
| Ex. 16 | 1.7 | 33.2 | 75.2 | 16.0 | 1.8 | 0.5 | 100 | 4 | 4 |
| Ex. 17 | 0.03 | 34.3 | 77.6 | 16.5 | 1.8 | 0.5 | 100 | 4 | 5 |

TABLE 4-continued

| | partical hydrolysate(A) | | | | | | | | |
|---|---|---|---|---|---|---|---|---|---|
| | fluorinated organic silane compound parts by mass* | (meth)acrylic group-containing silicon compound parts by mass* | organic silicon compound parts by mass* | metal alkoxide parts by mass* | 2N—HCl parts by mass | amount of used water molar ratio** | polymerizable monomer (B) parts by mass | photoinitiator (C) parts by mass* | viscosity (mPa · sec) |
| Ex. 18 | 0.3 | 34.0 | 77.0 | 16.4 | 1.8 | 0.5 | 100 | 4 | 5 |
| Ex. 19 | 0.3 | 35.7 | 75.8 | 16.1 | 1.8 | 0.8 | 100 | 4 | 5 |
| Comparative Ex. 7 | — | 34.3 | 77.7 | 16.5 | 1.8 | 0.5 | 100 | 4 | 5 |
| Comparative Ex. 8 | 0.3 | — | 61.4 | 13.1 | 1.4 | 0.5 | 100 | 4 | 6 |
| Comparative Ex. 9 | — | — | — | — | — | — | 100 | 4 | 108 |

*Blending amount (parts by mass) of each ingredient with respect to 100 parts by mass of polymerizable monomer
**Number of moles of used water with respect to the number of moles of all alkoxy groups (times) Inluding also water deriving from 2N—HCl

TABLE 5

| | Evaluation of filterability | Evaluation of adhesion | Evaluation of release property (N) | Evaluation of transcription property |
|---|---|---|---|---|
| Ex. 10 | ○ | 5 | <1 | ○ |
| Ex. 11 | ○ | 5 | <1 | ○ |
| Ex. 12 | ○ | 5 | 1 | ○ |
| Ex. 13 | ○ | 5 | 2 | ○ |
| Ex. 14 | ○ | 5 | <1 | ○ |
| Ex. 15 | ○ | 5 | 1 | ○ |
| Ex. 16 | ○ | 4 | <1 | ○ |
| Ex. 17 | ○ | 5 | 1 | ○ |
| Ex. 18 | Δ | 5 | 3 | ○ |
| Ex. 19 | ○ | 5 | 1 | ○ |
| Comparative Ex. 7 | ○ | 5 | 6 | ○ |
| Comparative Ex. 8 | x | 3 | 7 | x |
| Comparative Ex. 9 | ○ | 1 | 10 | ○ |

TABLE 6

| | dry etching rate (nm/min) | |
|---|---|---|
| | oxygen gas | CHF₃ gas |
| Ex. 10 | 2 | 19 |
| Ex. 11 | 1 | 14 |
| Ex. 12 | 1 | 12 |
| Ex. 13 | 5 | 17 |
| Ex. 14 | 1 | 14 |
| Ex. 15 | 1 | 14 |
| Ex. 16 | 1 | 14 |
| Ex. 17 | 1 | 14 |
| Ex. 18 | 1 | 17 |
| Ex. 19 | 1 | 14 |
| Comparative Ex. 7 | 1 | 14 |
| Comparative Ex. 9 | 193 | 16 |

The invention claimed is:

1. A photo-curable nanoimprint composition, said composition comprising:
(A) partial hydrolysate,
(B) polymerizable monomer having (meth)acrylic group; and
(C) photoinitiator,
wherein said partial hydrolysate (A) is selected from a group consisting of (A-1) mixture of partial hydrolysate of organic silicon compound having a general formula (1):

$$R^1O-\left(Si(OR^1)_2-O\right)_n-R^1 \tag{1}$$

(wherein, each of $(R^1)$s is, same or different, $C_{1-4}$ alkyl group; n is an integer of 1-10; and partial hydrolysate of (meth) acrylic group-containing silicon compound having a general formula (2):

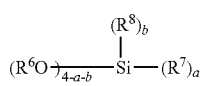

$$(2)$$

wherein $R^2$ is hydrogen atom or methyl group; $R^3$ is $C_{1-10}$ alkylene group, $C_{3-10}$ cycloalkylene group, or $C_{3-10}$ polymethylene group; $R^4$ is $C_{1-4}$ alkyl group, $C_{3-4}$ cycloalkyl group, or $C_{6-12}$ aryl group; $R^5$ is $C_{1-4}$ alkyl group or $C_{3-4}$ cycloalkyl group; l is an integer of 1-3, m is an integer of 0-2, and k is an integer of 1-3, but (l+m+k) is 4; in case that each of $R^2$, $R^3$, $R^4$ and $R^5$ is present in plural, each of $(R^2)$s, $(R^3)$s, $(R^4)$s and $(R^5)$s may be same or different;

(A-2) mixture of partial hydrolysate of fluorinated organic silane compound having a general formula (3):

$$(R^6O)_{4-a-b}-Si(R^8)_b-(R^7)_a \tag{3}$$

wherein each of $R^6$ and $R^8$ is $C_{1-10}$ alkyl group or $C_{3-10}$ cycloalkyl group; $R^7$ is $C_{1-100}$ fluorine-containing alkyl group, fluorine-containing cycloalkyl group, or fluorine-containing alkoxy ether group; a is an integer of 1-3 and b is an integer of 0-2, but (a+b) is 1-3; in case that each of $R^6$, $R^7$ and $R^8$ is present in plural, each of $(R^6)$s, $(R^7)$s and $(R^8)$s may be same or different and said partial hydrolysate of (meth)acrylic group-containing silicon compound having the general formula (2); and (A-3) mixture of said partial hydrolysate of organic silicon compound having the general formula (1), said partial hydrolysate of (meth)acrylic group-containing silicon compound having the general formula (2), and said partial hydrolysate of fluorinated organic silane compound having the general formula (3), and wherein said partial hydrolysate (A) comprises further partial hydrolysate of metal alkoxide having a general formula (5)

wherein, M is zirconium or titanium and each of $(R^9)$s is, same or different, $C_{1-10}$ alkyl group).

2. The photo-curable nanoimprint composition according to the claim 1, wherein the partial hydrolysate (A) comprises the (A-1) mixture of partial hydrolysates of organic silicon compound having the general formula (1) and partial hydrolysate of (meth)acrylic group-containing silicon compound having the general formula (2) and the partial hydrolysate of metal alkoxide having the general formula (5), said partial hydrolysate (A) being a product obtained by hydrolyzing a mixture of the organic silicon compound having the general formula (1), the (meth)acrylic group-containing silicon compound having the general formula (2) and the metal alkoxide having the general formula (5) with water in the molar amount of not less than 0.1 times but less than 1.0 times with respect to the number of moles of all alkoxy groups present in the mixture.

3. The photo-curable nanoimprint composition according to the claim 1, wherein the partial hydrolysate (A) comprises the (A-2) mixture of partial hydrolysate of fluorinated silane compound having the general formula (3) and partial hydrolysate of (meth)acrylic group-containing silicon compound having the general formula (2) and the partial hydrolysate of metal alkoxide having the general formula (5), said partial hydrolysate (A) being a product obtained by hydrolyzing a mixture of the fluorinated silane compound having the general formula (3), the (meth)acrylic group-containing silicon compound having the general formula (2) and the metal alkoxide having the general formula (5) with water in the molar amount of not less than 0.1 times but less than 1.0 times with respect to the number of moles of all alkoxy groups present in the mixture.

4. The photo-curable nanoimprint composition according to the claim 1, wherein the partial hydrolysate (A) comprises the (A-3) mixture of partial hydrolysate of organic silicon compound having the general formula (1), partial hydrolysate of (meth)acrylic group-containing silicon compound having the general formula (2) and partial hydrolysate of fluorinated silane compound having the general formula (3) and the partial hydrolysate of metal alkoxide having the general formula (5), said partial hydrolysate (A) being a product obtained by hydrolyzing a mixture of the organic silicon compound having the general formula (1), the (meth)acrylic group-containing silicon compound having the general formula (2), the fluorinated silane compound having the general formula (3) and the metal alkoxide having the general formula (5) with water in the molar amount of not less than 0.1 times but less than 1.0 times with respect to the number of moles of all alkoxy groups present in the mixture.

5. The photo-curable nanoimprint composition according to the claim 1, wherein the partial hydrolysate (A) comprises the (A-3) mixture of partial hydrolysate of organic silicon compound having the general formula (1), partial hydrolysate of (meth)acrylic group-containing silicon compound having the general formula (2) and partial hydrolysate of fluorinated silane compound having the general formula (3) and the partial hydrolysate of metal alkoxide having the general formula (5), said partial hydrolysate (A) being a product obtained by the steps of hydrolyzing a mixture of the (meth)acrylic group-containing silicon compound having the general formula (2) and the fluorinated silane compound having the general formula (3) with water in the molar amount of not less than 0.1 times but less than 1.0 times with respect to the number of moles of all alkoxy groups present in the mixture to prepare a mixture of the partial hydrolysate of (meth)acrylic group-containing silicon compound having the general formula (2) and the partial hydrolysate of fluorinated silane compound having the general formula (3), adding the organic silicon compound having the general formula (1) and the metal alkoxide having the general formula (5) to the prepared mixture of the partial hydrolysates, and hydrolyzing the resulting mixture with water in the molar amount of not less than 0.1 times but less than 1.0 times with respect to the number of moles of all alkoxy groups present in the mixture.

6. The photo-curable nanoimprint composition according to claim 1, wherein said composition comprises the (A-1) mixture of partial hydrolysates obtained by hydrolyzing a mixture of 10-250 part by mass of the organic silicon compound having the general formula (1) and 3-300 parts by mass of the (meth)acrylic group-containing silicon compound having the general formula (2) with water in the molar amount of not less than 0.1 times but less than 1.0 times with respect to the number of moles of all alkoxy group present in the mixture, and 1-10 parts by mass of the photoinitiator (C) with respect to 100 parts by mass of the polymerizable monomer having (meth)acrylic group (B).

7. The photo-curable nanoimprint composition according to claim 1, wherein said composition comprises the (A-2) mixture of partial hydrolysates, each of which is obtained by hydrolyzing 0.001-4 part by mass of the fluorinated organic silane compound or 3-300 parts by mass of the (meth)acrylic group-containing silicon compound, and 1-10 parts by mass of the photoinitiator (C) with respect to 100 parts by mass of the polymerizable monomer having (meth)acrylic group (B).

8. The photo-curable nanoimprint composition according to claim 1, wherein said composition comprises the (A-3) mixture of partial hydrolysates, each of which is obtained by hydrolyzing 0.001-4 part by mass of the fluorinated organic silane compound, 10-250 parts by mass of the organic silicon compound, or 3-300 parts by mass of the (meth)acrylic group-containing silicon compound, and 1-10 parts by mass of the photoinitiator (C) with respect to 100 parts by mass of the polymerizable monomer having (meth)acrylic group (B).

9. The photo-curable nanoimprint composition according to claim 1, wherein the partial hydrolysate (A) comprises 0.2-100 parts by mass of metal alkoxide with respect to 100 parts by mass in total of the organic silicon compound (1) and the (meth)acrylic group-containing silicon compound (2) in case of the mixture of partial hydrolysates (A-1), in the total of the fluorinated organic silane (3) and the (meth)acrylic group-containing silicon compound (2) in the case of the mixture of partial hydrolysates (A-2), or in the total of the organic silicon compound (1), the (meth)acrylic group-containing silicon compound (2) and the fluorinated silane compound (3) in case of the mixture of partial hydrolysates (A-3).

10. A method of forming a pattern on a substrate by nanoimprinting, said method comprises the steps of applying the photo-curable nanoimprint composition according to claim 1 on said substrate to form a coating film of said composition;

contacting said coating film with a pattern-forming surface of a mold, on which a desirable pattern has been formed, and irradiating with light as remaining the situation to cure said coating film, and releasing said mold from the cured coating film, whereby a pattern which corresponds to the pattern formed in said pattern-forming surface of mold is formed on said substrate.

11. A replica mold for nanoimprint, wherein said mold has the cured product of the photo-curable nanoimprint composition according to claim 1.

12. A replica mold for nanoimprint, wherein said mold has the cured product of the photo-curable nanoimprint composition according to claim 2.

13. A replica mold for nanoimprint, wherein said mold has the cured product of the photo-curable nanoimprint composition according to claim 3.

14. A replica mold for nanoimprint, wherein said mold has the cured product of the photo-curable nanoimprint composition according to claim 4.

15. A replica mold for nanoimprint, wherein said mold has the cured product of the photo-curable nanoimprint composition according to claim 5.

16. A replica mold for nanoimprint, wherein said mold has the cured film of the photo-curable nanoimprint composition according to claim 5.

* * * * *